(12) United States Patent
Choi et al.

(10) Patent No.: US 10,693,136 B2
(45) Date of Patent: Jun. 23, 2020

(54) LITHIUM COMPLEX OXIDE FOR LITHIUM SECONDARY BATTERY POSITIVE ACTIVE MATERIAL AND METHOD OF PREPARING THE SAME

(71) Applicant: ECOPRO BM CO., LTD., Cheongju-si, Chungcheongbuk-do (KR)

(72) Inventors: Moon Ho Choi, Cheongju-si (KR); Jong Seung Shin, Chungcheongbuk-do (KR); Dong Hee Kim, Changwon-si (KR); Suk Yong Jeon, Chungju-si (KR); Hyun Jong Yu, Cheongju-si (KR); Kyoung Jun Lee, Cheongju-si (KR); Young Nam Park, Incheon (KR)

(73) Assignee: ECOPRO BM CO., LTD., Cheongju-si (KR)

( * ) Notice: Subject to any disclaimer, the term of this patent is extended or adjusted under 35 U.S.C. 154(b) by 37 days.

(21) Appl. No.: 15/459,567

(22) Filed: Mar. 15, 2017

(65) Prior Publication Data

US 2018/0013145 A1    Jan. 11, 2018

(30) Foreign Application Priority Data

Jul. 11, 2016 (KR) .................. 10-2016-0087527
Oct. 10, 2016 (KR) .................. 10-2016-0130562

(51) Int. Cl.
*H01M 4/525* (2010.01)
*C30B 7/14* (2006.01)
(Continued)

(52) U.S. Cl.
CPC .......... *H01M 4/525* (2013.01); *C01G 53/42* (2013.01); *C01G 53/66* (2013.01); *C30B 7/14* (2013.01);
(Continued)

(58) Field of Classification Search
CPC . C01G 53/42; C01G 53/66; H01M 2004/021; H01M 10/0525; H01M 4/525;
(Continued)

(56) References Cited

U.S. PATENT DOCUMENTS 6,921,609 B2 † 7/2005 Lampe-Onnerud
7,381,496 B2   6/2008 Onnerud
(Continued)

FOREIGN PATENT DOCUMENTS

JP    2011-124086    *  6/2011  ............ H01M 4/505
KR   20130138073 A    12/2013
(Continued)

OTHER PUBLICATIONS

Xiaolei Su et al. in Improvement of permittivity of SiC with Al doping by combustion synthesis using Al2O3 in journal of Alloys vol. 492 (2010)L16-L19 (Year: 2010).*
(Continued)

*Primary Examiner* — Jonathan G Jelsma
*Assistant Examiner* — Omar M Kekia
(74) *Attorney, Agent, or Firm* — Lucas & Mercanti, LLP

(57) ABSTRACT

Disclosed is a lithium complex oxide and method of manufacturing the same, more particularly, a lithium complex oxide effective in improving the characteristics of capacity, resistance, and lifetime with reduced residual lithium and with different interplanar distances of crystalline structure between a primary particle locating in a internal part of secondary particle and a primary particle locating on the surface part of the secondary particle, and a method of preparing the same.

15 Claims, 39 Drawing Sheets

(51) Int. Cl.
  *C30B 29/60* (2006.01)
  *C30B 29/22* (2006.01)
  *C01G 53/00* (2006.01)
  *H01M 10/0525* (2010.01)
  *H01M 4/02* (2006.01)

(52) U.S. Cl.
  CPC .............. *C30B 29/22* (2013.01); *C30B 29/60* (2013.01); *H01M 10/0525* (2013.01); *C01P 2002/50* (2013.01); *C01P 2002/52* (2013.01); *C01P 2002/72* (2013.01); *C01P 2002/74* (2013.01); *C01P 2002/85* (2013.01); *C01P 2004/04* (2013.01); *C01P 2004/50* (2013.01); *C01P 2004/80* (2013.01); *C01P 2006/40* (2013.01); *H01M 2004/021* (2013.01); *H01M 2004/028* (2013.01)

(58) Field of Classification Search
  CPC .......... H01M 2004/028; C01P 2004/50; C01P 2002/50; C01P 2006/40; C01P 2002/74; C01P 2004/80; C01P 2002/52; C01P 2002/72; C01P 2002/85; C01P 2004/04; C30B 29/60; C30B 7/14; C30B 29/22
  USPC ........................................................ 429/233
  See application file for complete search history.

(56) References Cited

U.S. PATENT DOCUMENTS

| | | | |
|---|---|---|---|
| 9,391,317 B2 † | 7/2016 | Ofer | |
| 2009/0200508 A1* | 8/2009 | Nagase | H01M 4/505 252/182.1 |
| 2012/0009474 A1* | 1/2012 | Yanagihara | C01G 53/42 429/219 |
| 2014/0038053 A1* | 2/2014 | Endo | H01M 4/0471 429/223 |
| 2014/0054495 A1* | 2/2014 | Paulsen | C01G 53/50 252/182.1 |
| 2014/0158932 A1* | 6/2014 | Sun | H01M 4/13 252/182.1 |
| 2016/0181611 A1 † | 6/2016 | Cho | |
| 2017/0288262 A1 | 10/2017 | Choi et al. | |
| 2017/0346128 A1 | 11/2017 | Fujii et al. | |

FOREIGN PATENT DOCUMENTS

| | | |
|---|---|---|
| KR | 20140081663 A | 7/2014 |
| KR | 20160074236 A | 6/2016 |
| WO | 2016103511 A1 | 6/2016 |
| WO | 2016108375 A1 | 7/2016 |

OTHER PUBLICATIONS

Machine English language translation of Fukuchi et al. JP 2011-124086 Positive electrode active material for lithium secondary battery, manufacturing method thereof, and lithium secondary battery (Year: 2011).*
Extended European Search Report, Application No. 17175368.4, dated Apr. 5, 2018.
Byung-Beom Lim et al, Advanced Functional Materials, 25 (2015) 4673-4680.
Daxion Zuo et al, Journal of Alloys and Compounds, 2017; 706: 24-40.
Hyejung Kim et al, Nano Letters, 2015, 15, 2111-2119.
Anthony W. Moses et al, Applied Surface Science, 253 (10) 2007, 4782-4791.
Daocong Li et al, Journal of Alloys and Compounds, 457 (2008) L1-L5.
Feng Lin et al, Nature Communications, 2014, 5:3529.
Junhyeok Kim et al, Energy Environ. Sci., 2018; 11: 1449-1459.
Eung-Ju Lee et a, Journal of Power Sources, 273 (2015) 663-669.
Chang-Heum Jo et al, Nano Research, 2015; 8(5): 1464-1479.
Shijian Zheng et al; Journal of the Electrochemical Society, 2011; 158: A357-A362.
Shoichiro Watanabe et al; J. Power Sources, vol. 258, 210-217 (2014).
Jisuk Kim et al; Electrochemical and Solid State Letters, 2006, 9(1) A19-A23.
Pengfei Yan et al; Nature Communications, vol. 8, Article No. 14101, 2017.
Feng Lin et al, Surface reconstruction and chemical evolution of stoichiometric layered cathode materials for lithium-ion batteries; Nature Communications, 2014, 5:3529; DOI:10.1038/ncomms4529; 1-9.†
Daocong Li et al, Synthesis and characterization of LiNi0.9Co0.1O2 for lithium batteries by a novel method; Journal of Alloys and Compounds 457 (2008) L1-L5.†
Anthony W. Moses et al, Surface properties of LiCoO2, LiNiO2 and LiNi1-xCoxO2; Applied Surface Science 253(10) 2007, 4782-4791.†
Jaephil Cho et al, A New Coating Method for Alleviating Surface Degradation of LiNi0.6Co0.2Mn0.2O2 Cathode Material: Nanoscale Surface Treatment of Primary Particles; Nano Letters 2015, 15, 2111-2119.†
Daxian Zuo et al, Recent progress in surface coating of cathode materials for lithium ion secondary batteries; Journal of Alloys and Compounds 706 (2017) 24-40.†
Byung-Beom Lim et al, Advanced Concentration Gradient Cathode Material with Two-Slope for High-Energy and Safe Lithium Batteries; Advanced Functional Materials 25 (2015) 4673-4680.†
Extended European Search Report for EP Application 17175368.4 dated Apr. 5, 2018.†

\* cited by examiner
† cited by third party

EDS mapping →

✓ Rod-shape: EDS mapping

◆ Analyzing concentration grade on particle surface

LITHIUM COMPLEX OXIDE FOR LITHIUM SECONDARY BATTERY POSITIVE ACTIVE MATERIAL AND METHOD OF PREPARING THE SAME

CROSS-REFERENCE TO RELATED APPLICATIONS

This application claims priority under 35 U.S.C. § 119 from Korean Patent Application No. 10-2016-0087527 filed Jul. 11, 2016 and Korean Patent Application No. 10-2016-0130562 filed Oct. 10, 2016, in the Korean Intellectual Property Office, the entire contents of each of which are hereby incorporated by reference.

BACKGROUND OF THE INVENTION

Embodiments of the inventive concept described herein relate to a lithium complex oxide and a method of preparing the same, and more particularly, relate to a lithium complex oxide, and a method of preparing the same, improving the characteristics of capacity, resistance, and battery lifetime with different interplanar distances of crystalline structure between a primary particle locating on the surface part of a secondary particle and a primary particle locating in the internal part secondary particle by coating different elements on the surface part, in consideration of inclination to functional degradation but reduction of residual lithium after a washing for removing the residual lithium in a preparation process, for a positive active material where lithium ion pathways in a-axis and c-axis of a crystalline structure.

With an increase of technology and demand for mobile devices, secondary batteries as energy sources are increasing in demand. Among secondary batteries, lithium (Li) secondary batteries are being now commercialized and widely used on the merits of high energy density and operating potential, long cycle lifetime, and low discharge rate.

A positive active material for a lithium secondary battery usually employs a lithium-contained cobalt oxide ($LiCoO_2$). It is also considered therefor even to use a lithium-contained manganese oxide such as layered crystalline structure of $LiMnO_2$ or spinel crystalline structure of $LiMn_2O_4$, or a lithium-contained nickel oxide such as $LiNiO_2$.

Among those positive active materials, $LiCoO_2$ is most frequently used because of good characteristics of battery lifetime and charge/discharge efficiency, but there is a limit to competitiveness of cost in mass use as power sources for middle/large-scale batteries of electric vehicles because cobalt (Co) is rare and expensive as a resource, and small in capacity. Although the lithium manganese oxide such as $LiMnO_2$ or $LiMn_2O_4$, as the positive active material, is low in price, eco-friendly, and highly stable in heat, it is deteriorative in high temperature and cycle characteristics.

A method of preparing a lithium complex oxide generally includes the steps of manufacturing transition metal precursors, mixing a lithium compound and the transition metal precursors, and then baking the mixture. During this, LiOH and/or $Li_2CO_3$ are/is used for the lithium compound. It is generally preferred to use $Li_2CO_3$ in the case that Ni content of the positive active material is equal to or lower than 65% and preferred to use LiOH in the case that Ni content of the positive active material is equal to or higher than 65%.

However, a nickel (Ni) rich system containing nickel equal to or higher than 65%, reactive at a low temperature, has a problem of having much residual lithium which remains in a form of LiOH and $Li_2CO_3$ on the surface of a positive active material. The residual lithium, that is, unreacted LiOH and $Li_2CO_3$ generate gas and a swelling effect by reacting with an electrolyte in the battery, and then cause high temperature stability to be seriously worse. Additionally, the unreacted LiOH also causes gelation because its viscosity is high when mixing slurry before manufacturing electrode plates.

To remove such unreacted Li, the inventors executed a washing process after preparing a positive active material, thereby much reducing residual lithium. However, during the washing process, the surface of the positive active material was damaged and degraded in characteristics of capacity and efficiency. Additionally, there was another problem to increase resistance in high temperature storage. Therefore, it is necessary to improve the characteristics of capacity, efficiency, and battery lifetime as well as to reduce residual lithium.

SUMMARY OF THE INVENTION

Embodiments of the inventive concept provide a lithium complex oxide of a new structure improving the characteristics of capacity, resistance, and battery lifetime as well as reducing residual lithium.

According to an aspect of an embodiment, a lithium complex oxide secondary particle is formed by coagulation of a plurality of primary particles and satisfy a relation that is d1>d2, where that the d1 is an interplanar distance of a crystalline structure in a primary particle locating in the internal part of secondary particle among the plurality of primary particles, and the d2 is an interplanar distance of a crystalline structure in a primary particle locating on a surface part of the secondary particle relation.

The present inventors have already filed an application about a structure which a lithium ion pathway is formed in a primary particle of a lithium complex oxide. The inventive concept is technically characterized in that interplanar distances forming such a lithium ion pathway may be different between a primary particle locating in the internal part secondary particle and a primary particle locating on the surface part of the secondary particle. That is, a lithium complex oxide secondary particle according to the inventive concept is characterized in that an interplanar distance of a primary particle locating in the internal part of secondary particle may be different from an interplanar distance of a primary particle locating on the surface part of the secondary particle, and for example an interplanar distance of a primary particle locating in the internal part of the secondary particle is formed larger than an interplanar distance of a primary particle locating on the surface part of the secondary particle.

In the lithium complex oxide secondary particle according to the inventive concept, the interplanar distances d1 and d2 mean averages of 10 adjacent interplanar distances based on an interplanar distance of a part which is measured by a crystalline structure spectrometry such as TEM analysis for a positive active material.

In the lithium complex oxide secondary particle, the d1, which is the interplanar distance of the crystalline structure in the primary particle locating in the internal part of secondary particle, is configured to be equal to or larger than 4.8 nm.

In the lithium complex oxide secondary particle, the d2, which is the interplanar distance of the crystalline structure in the primary particle locating on the surface part of the secondary particle, may be equal to or smaller than 4.75 nm.

The lithium complex oxide secondary particle may be in a hexagonal structure and a lithium ion pathway may be formed toward the center from the surface of the secondary particle.

In the lithium complex oxide secondary particle, a primary particle locating on the surface part of the secondary particle means a primary particle locating at a surface part on which different metals are coated. In the lithium complex oxide secondary particle, a primary particle locating in the internal part of secondary particle may mean a primary particle of the inside, except the surface part of the secondary particle.

In the lithium complex oxide secondary particle, for defining a primary particle locating on the surface part of the secondary particle, a thickness of the surface part of the secondary particle may be in 50 to 200 nm from the outer shell of the secondary particle.

In the lithium complex oxide secondary particle, the surface part of the secondary particle may have a grade of Co ion concentration.

In the lithium complex oxide secondary particle, a primary particle locating on the surface part of the secondary particle may have a concentration grade with Co ion concentration therein, and Co ion concentration is not a constant.

In the lithium complex oxide secondary particle, primary particles locating on the surface part of the secondary particle and primary particles locating in the internal part of secondary particle have concentration grading portions, which exhibit Co ion concentration, at boundaries of the primary particles.

The lithium complex oxide secondary particle may have a bound energy (P1) of spin-orbit-spit 2p3/2 peak and a bound energy (P2) of 2p1/2 peak in a Co 2p core-level spectrometry obtained through XPS measurement, and the P1 and the P2 are ranged in 779 eV≤P1≤780 eV and 794 eV≤P2≤795 eV.

The lithium complex oxide secondary particle may have a ratio of peak intensity ($I_{531}$) around 531 eV and peak intensity ($I_{528}$) around 528.5 eV during an O 1s core-level spectrometry that is obtained through XRS measurement, wherein, wherein I531/I528≤2.

The lithium complex oxide secondary particle may have a ratio between peak intensity ($I_{289}$) around 289 eV and peak intensity ($I_{284}$) around 284.5 eV during a C is core-level spectrometry that is obtained through XRS measurement, wherein I289/I284≤0.9.

The lithium complex oxide secondary particle may be given by the following Formula 1,

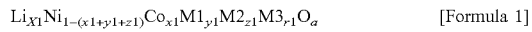

$$Li_{X1}Ni_{1-(x1+y1+z1)}Co_{x1}M1_{y1}M2_{z1}M3_{r1}O_a$$ [Formula 1]

In Formula 1, M1 is Mn or Al, and M2 and M3 are metals selected from a group of Al, Ba, B, Co, Ce, Cr, F, Li, Mg, Mn, Mo, P, Sr, Ti, and Zr, and 0.95≤X1≤1.05, 1.50≤a≤2.1, 0.02≤x1≤0.25, 0.01≤y1≤0.20, 0≤z≤0.20, and 0≤r1≤0.20.

According to another aspect of the inventive concept, a method of preparing a lithium complex oxide secondary particle includes: manufacturing precursors of a lithium complex oxide secondary particle given by the following Formula 2,

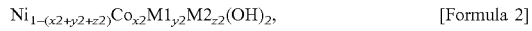

$$Ni_{1-(x2+y2+z2)}Co_{x2}M1_{y2}M2_{z2}(OH)_2,$$ [Formula 2]

wherein, in Formula 2, M1 is Mn or Al, and M2 is a metal selected from a group of Al, Ba, B, Co, Ce, Cr, F, Li, Mg, Mn, Mo, P, Sr, Ti, and Zr, and wherein 0≤x2≤0.25, 0≤y2≤0.20, and 0≤z2≤0.20; reacting precursors of a lithium complex oxide secondary particle with a lithium compound and manufacturing a positive active material by first thermal treating the reactant; washing the positive active material with distilled water or an alkaline solution; mixedly agitating the washed positive active material with a solution containing M2, which is a metal selected from a group of Al, Ba, B, Co, Ce, Cr, F, Li, Mg, Mn, Mo, P, Sr, Ti, and Zr, or with a solution containing a compound containing the M2, and reactively coating the surface; drying particles of the positive active material; and mixing the dried positive active material with M3, which is a metal selected from a group of Al, Ba, B, Co, Ce, Cr, F, Li, Mg, Mn, Mo, P, Sr, Ti, and Zr, or with a compound containing the M3, and doping the metal M3 into the particles by second thermally treating the mixture.

Still another aspect of the inventive concept provides a lithium secondary battery including a lithium complex oxide secondary particle according to embodiments of the inventive concept.

In the lithium secondary battery according to the inventive concept, residual lithium may be equal to or smaller than 6,000 ppm.

In the method of preparing a lithium complex oxide secondary particle according to the inventive concept, the first thermal treatment may be processed in 700 to 900° C.

In the method of preparing a lithium complex oxide secondary particle according to the inventive concept, the second thermal treatment may be processed in 400 to 750° C.

In the method of preparing a lithium complex oxide secondary particle according to the inventive concept, concentration of the solution containing the compound containing the M2 may be 1 to 10 mol %.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION OF THE INVENTION

Hereafter, embodiments of the inventive concept will be described in detail with reference to the accompanying figures. The inventive concept may not be however restrictive to the embodiments proposed below.

<Comparison 1>

A $LiCoO_2$ positive active material, which is commercially sold, was used for Comparison 1.

<Experimental Example> Measuring Distance Between Crystalline Structures

Figure 1:
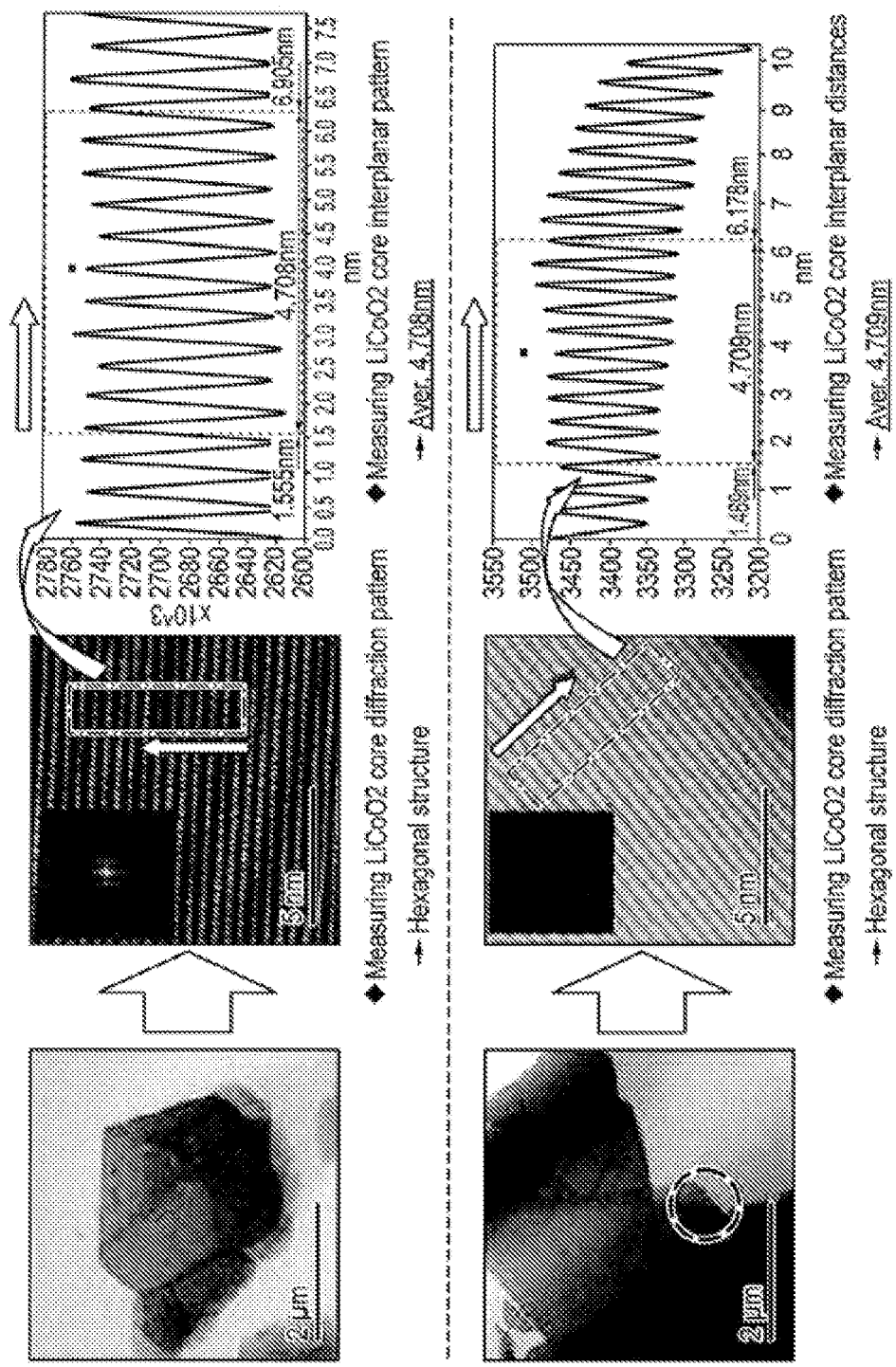
FIG. 1 shows a result of measuring diffraction patterns and interplanar distances of an $LiCoO_2$ positive active material of Comparison 1 according to the inventive concept.

FIG. 1 shows respective diffraction patterns and interplanar distances for a primary particle, which locates in a secondary particle, and a primary particle locating on the surface part of the secondary particle of the $LiCoO_2$ positive active material of Comparison 1.

After mounting the $LiCoO_2$ positive active material on a carbon grid, coating the $LiCoO_2$ positive active material with carbon and PT, and then magnifying the coated $LiCoO_2$ positive active material in 20 million or 25 million times through a TEM pre-treatment that slices the coated $LiCoO_2$ positive active material, ten interplanar distances were measured left and light around an interplanar distance to be known.

As shown in FIG. 1, diffraction patterns of the primary particles locating in the secondary particle of the $LiCoO_2$ positive active material and locating on the surface part of the secondary particle were all in hexagonal structure, and interplanar distances of the primary particles locating in the internal part of secondary particle and locating on the surface part of the secondary particle were all measured as 4.70 nm.

<Embodiment 1> Manufacturing Positive Active Material

First, $NiCo(OH)_2$ precursors were manufactured through a co-precipitation. Then, a lithium secondary battery positive active material was manufactured by adding $Li_2CO_3$ and LiOH as lithium compounds to the manufactured precursors, adding Al and Mg as M1 thereto, and processing the mixture in first thermal treatment.

After preparing distilled water, the manufactured lithium secondary battery positive active material was washed by injecting the distilled water in uniform temperature.

Afterward, the surface of the positive active material was washed and coated with Co as M2 by agitating the positive active material while injecting a cobalt sulfate solution of 0.03 mol into the positive active material washing liquid for one hour in a specific ratio, and then dried at 120° C. under a vacuum.

Then, the lithium secondary battery positive active material was manufactured by adding Ti as M3 to the coated positive active material and processing the Ti-added positive active material in second thermal treatment at 450° C.

<Experimental Example> Measuring TEM and EDX

Figure 2:
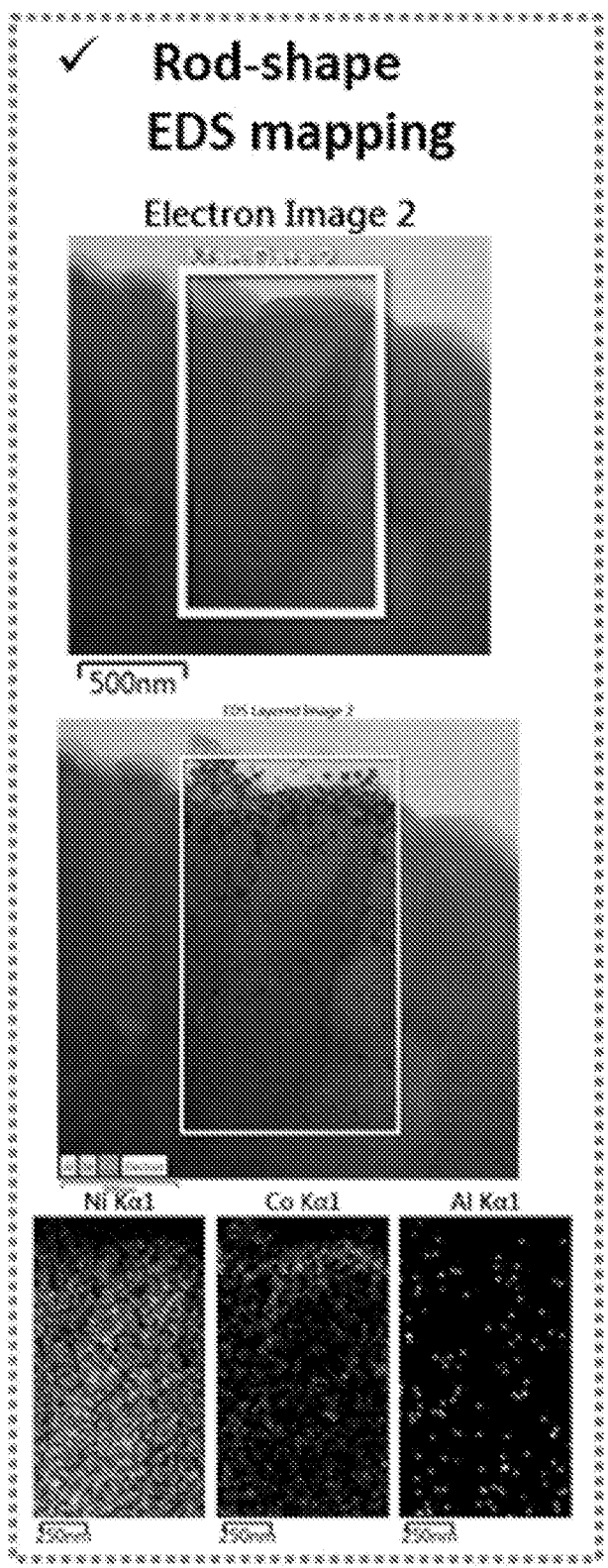
FIG. 2 shows a result of measuring TEM and EDX photographs of a positive active material prepared according to an embodiment of the inventive concept.

TEM and EDX photographs were taken from the positive active material manufactured through Embodiment 1 and shown in FIG. 2.

As shown in FIG. 2, the positive active material manufactured through Embodiment 1 of the inventive concept has Co concentration that is higher on the surface part of the secondary particle and lower toward the inside from the surface of the secondary particle. Co concentration is ununiform in the secondary particle with a grade.

Figure 3:
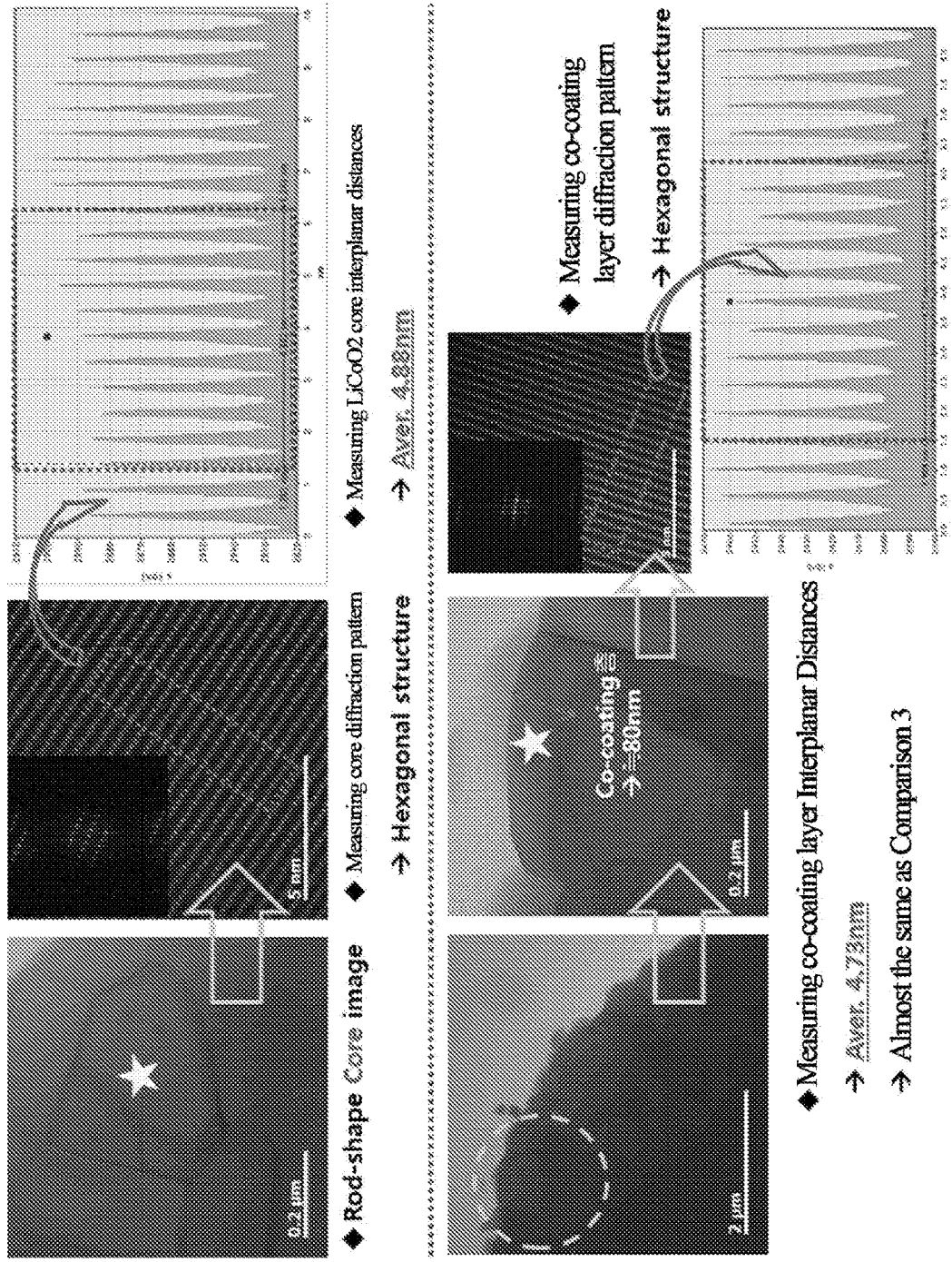
FIG. 3 shows a result of measuring diffraction patterns and interplanar distances of a positive active material prepared according to an embodiment of the inventive concept.

<Experimental Example> Measuring Interplanar Distances Between Crystalline Structures FIG. 3 shows respective diffraction patterns and interplanar distances for primary particles locating in the internal part of the secondary particle manufactured through Embodiment 1 and locating on the surface part on which Co and Ti are coated.

As shown in FIG. 3, the thickness of a Co-coated layer is about 80 nm, and the diffraction pattern of the primary particle locating in the secondary particle is in hexagonal structure. For the primary particle locating in the secondary particle, 10 adjacent interplanar distances were measured as 4.88 nm on average in a TEM photograph. Comparatively, the primary particle locating on the surface part having the Co-coated layer was measured as exhibiting a diffraction pattern of hexagonal structure with an interplanar distance of 4.73 nm.

From this result, it can be seen that the interplanar distance of the primary particle locating on the surface part was relatively reduced in comparison with the primary particle locating in the internal part of secondary particle which was not coated with cobalt, and the interplanar distance of the primary particle locating on the surface part was changed similar to an interplanar distance of $LiCoO_2$ of a comparison example.

<Embodiment 2> Manufacturing Positive Active Material

A positive active material of Embodiment 2 was manufactured in the same as Embodiment 1, but is different such that a cobalt solution having concentration of 4 mol % was added to the positive active material washing liquid.

<Experimental Example> Measuring TEM and EDX

Figure 4:
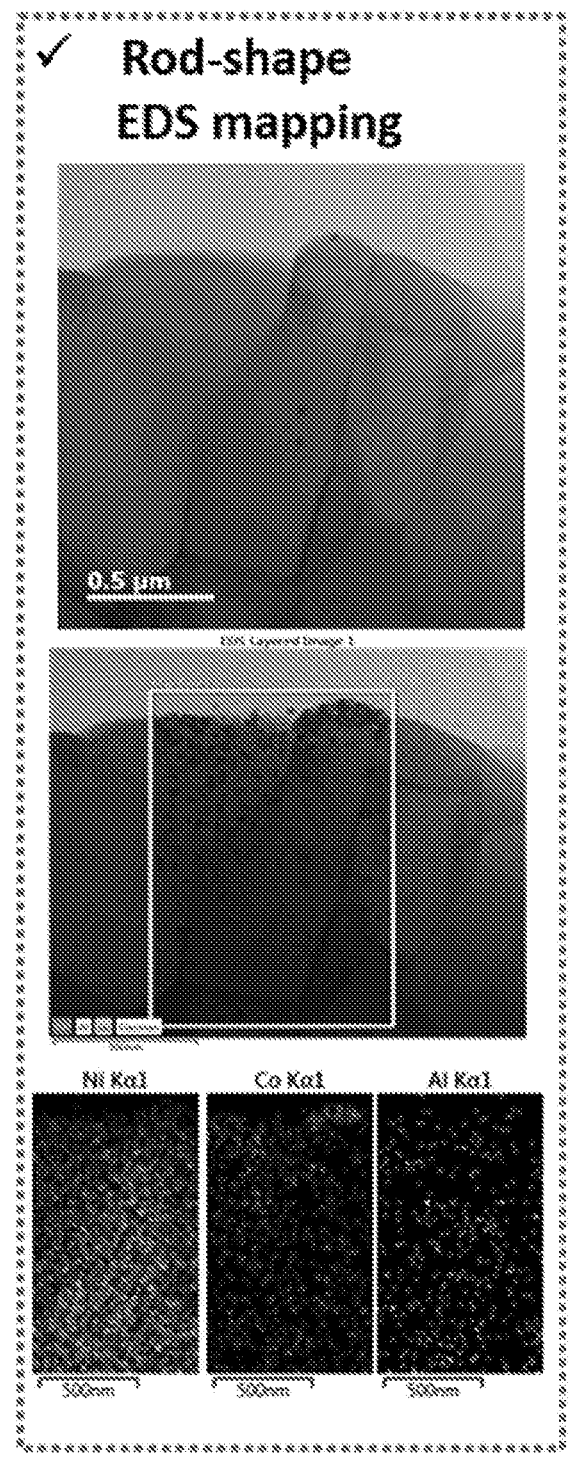
FIG. 4 shows a result of measuring TEM and EDX photographs of a positive active material prepared according to an embodiment of the inventive concept.

FIG. 4 shows a result of measuring TEM and EDX photographs of the positive active material manufactures through Embodiment 2.

As shown in FIG. 4, it can be seen that the positive active material manufactured through Embodiment 2 of the inventive concept has Co concentration that is higher on the surface part of the secondary particle and lower toward the inside of the secondary particle. That is, Co concentration of the positive active material is ununiform and distributed in a grade.

<Experimental Example> Measuring Distances Between Crystalline Structures

Figure 5:
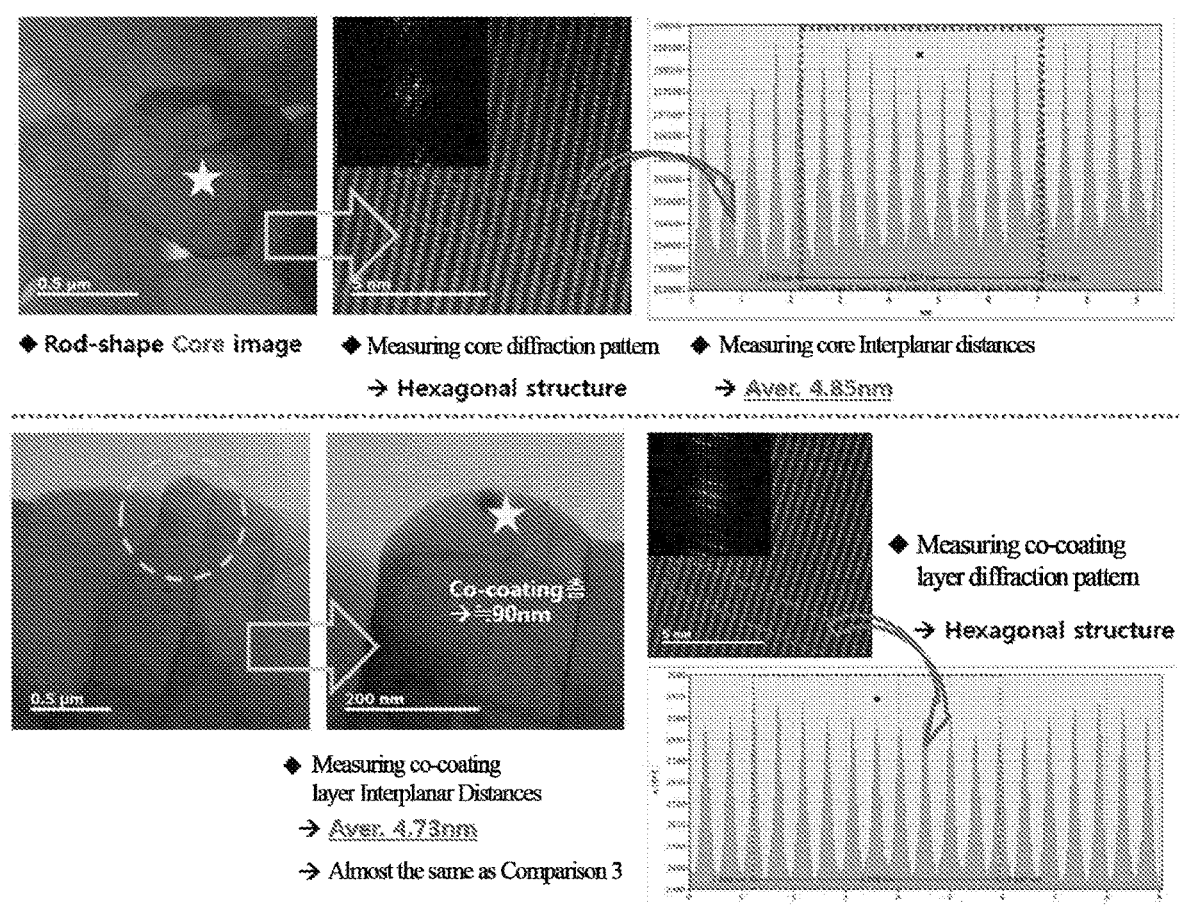
FIG. 5 shows a result of measuring diffraction patterns and interplanar distances of a positive active material prepared according to an embodiment of the inventive concept.

FIG. 5 shows a result of measuring respective diffraction patterns and interplanar distances of primary particles locating in the internal part of the positive active material manufactured through Embodiment 1 and locating on the surface part where Co and Ti are coated.

As shown in FIG. 5, it was measured that a thickness of the Co-coated layer was about 90 nm, a diffraction pattern of the primary particle locating in a secondary particle was in a hexagonal structure, and an average of 10 adjacent interplanar distances of the primary particle locating in the internal part of secondary particle was measured as 4.85 nm in a TEM photograph, while the primary particle locating on the surface part of the Co-coated layer had a diffraction pattern of hexagonal structure but an interplanar distance thereof was measured as 4.73 nm.

It can be seen that, comparative to the primary particle locating in the Co-uncoated secondary particle, the interplanar distance of the primary particle locating on the surface part was reduced and changed similar to the interplanar distance of $LiCoO_2$ of a comparison example.

<Embodiment 3> Manufacturing NCM-Based Positive Active Material

In the same manner with Embodiment 1, a positive active material of Embodiment 3 was manufactured by executing a coating process with 5 mol % concentration of a cobalt solution added to the positive active material washing liquid.

<Experimental Example> Concentration Scanning

Figure 6:
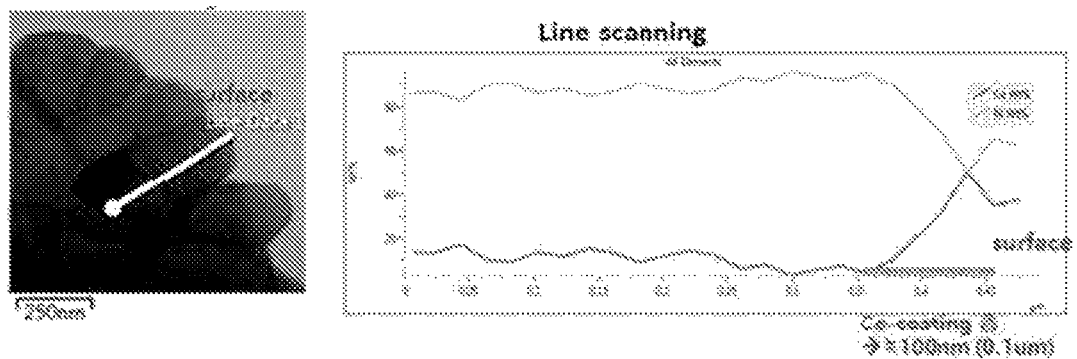
FIG. 6 shows a result of measuring respective variations of concentration for Ni, Co, and Al toward the center from the surface of a positive active material prepared according to an embodiment of the inventive concept.

FIG. 6 shows a result of measuring respective concentration variations of No, Co, and Al from the surface of the secondary particle of the positive active material, which is manufactured through Embodiment 3, toward the center of the particle.

From FIG. 6, it can be seen that the positive active material manufactured through Embodiment 3 of the inventive concept has Co concentration that becomes higher toward the center from the surface in the Co-coated layer where Co is coated, but after the Co-coated layer, the Co concentration turns to be reduced as close as the center and a thickness of the Co-coated layer is 0.1 μm.

<Experimental Example> TEM and EDX

Figure 7:
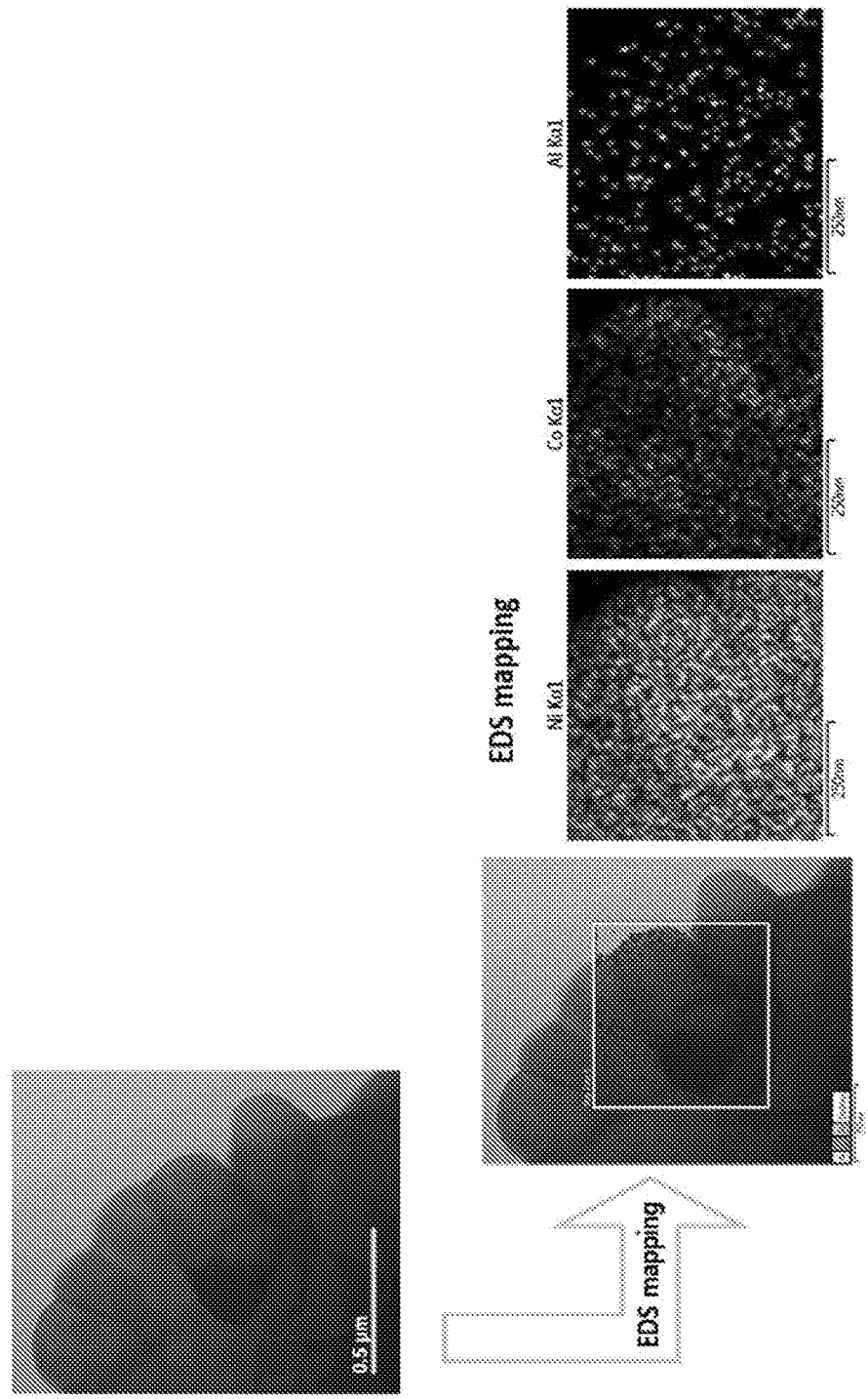
FIG. 7 shows a result of measuring an EDX photograph of a positive active material prepared according to an embodiment of the inventive concept.

FIG. 7 shows a result of measuring respective EDX photographs for Ni, Co, and Al from the surface of the secondary particle of the positive active material, which is manufactured through Embodiment 3, toward the center of the particle.

From FIG. 7, it can be seen that the positive active material manufactured through Embodiment 3 of the inventive concept has Co concentration that becomes higher toward the center from the surface in the Co-coated layer where Co is coated, but after the Co-coated layer, the Co concentration turns to be reduced as close as the center and concentration of the Co-coated layer is higher along the boundaries of the primary particles.

<Experimental Example> Measuring Distances Between Crystalline Structures

Figure 8:
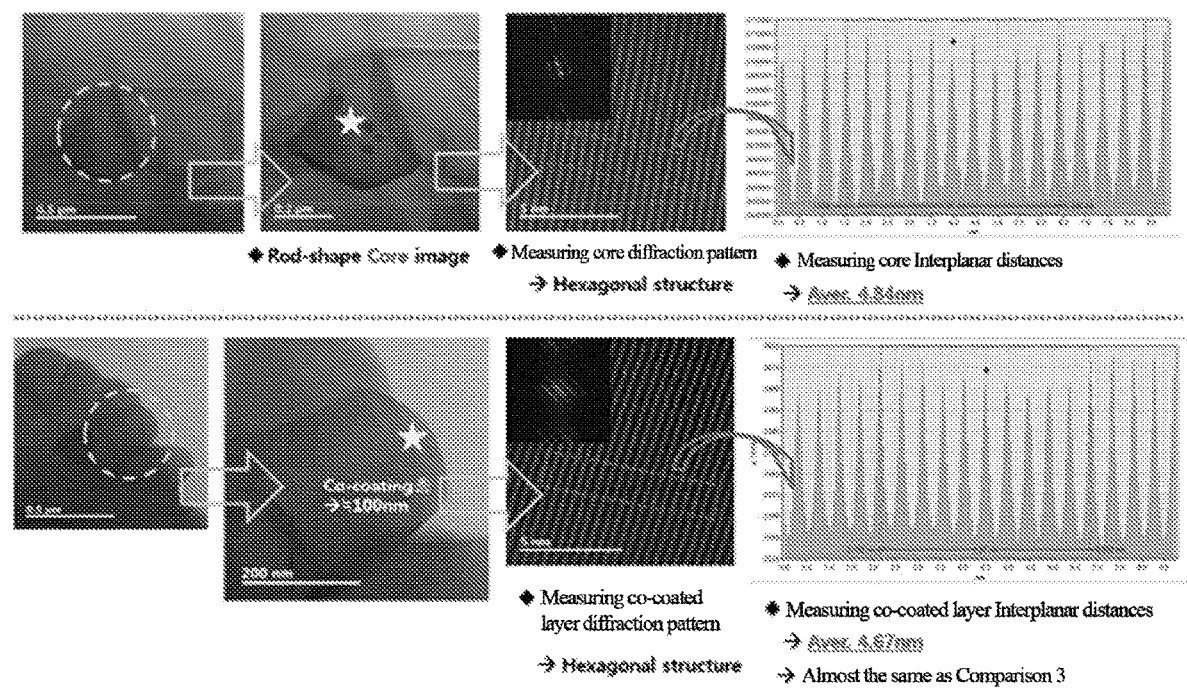
FIG. 8 shows a result of measuring diffraction patterns and interplanar distances of a positive active material prepared according to an embodiment of the inventive concept.

FIG. 8 shows a result of measuring respective diffraction patterns and interplanar distances of primary particles locating in the positive active material manufactured through Embodiment 3 and locating on the surface part on which Co and Ti are coated.

As shown in FIG. 8, it was measured that a thickness of the Co-coated layer was about 100 nm, a diffraction pattern of the primary particle locating in a secondary particle was in a hexagonal structure, and an average of 10 adjacent interplanar distances of the primary particle locating in the secondary particle was measured as 4.84 nm in a TEM photograph, while the primary particle locating on the Co-coated layer had a diffraction pattern of hexagonal structure but an interplanar distance thereof was measured as 4.67 nm.

It can be seen that, comparative to the primary particle locating in the Co-uncoated secondary particle, the interplanar distance of the primary particle locating on the Co-coated surface was reduced and changed similar to interplanar distances of $LiCoO_2$ of a comparison example.

<Embodiment 4> Manufacturing NCM-Based Positive Active Material

In the same manner with Embodiment 1, a positive active material of Embodiment 4 was manufactured by executing a washing and coating process with 10 mol % concentration of a cobalt solution added to the positive active material washing liquid.

<Experimental Example> Measuring TEM and EDX

Figure 9:
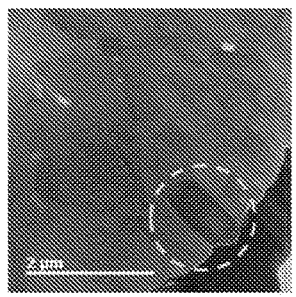
FIG. 9 shows a result of measuring TEM and EDX photographs of a positive active material prepared according to an embodiment of the inventive concept.
Figure 9:
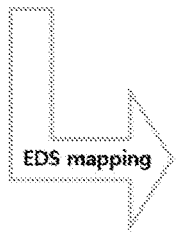
Figure 9:
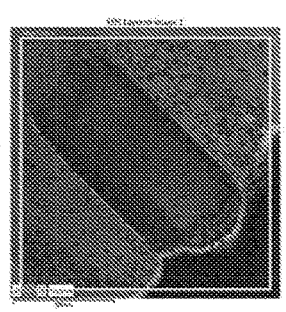
Figure 9:
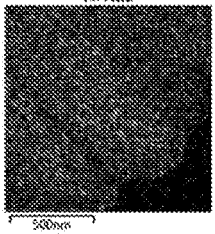
Figure 9:
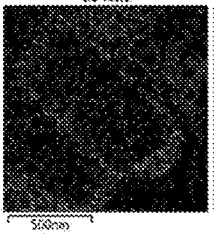
Figure 9:
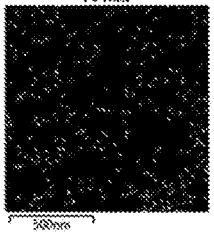

FIG. 9 shows a result of measuring TEM and EDX photographs on the surface of the secondary particle of the positive active material manufactured through Embodiment 4.

As shown in FIG. 9, it can be seen that the positive active material manufactured through Embodiment 4 of the inventive concept has Co concentration that becomes higher on the surface of the secondary particle but turns to be lower as close as the center of the secondary particle. Thus, the Co concentration is ununiform in a grade.

Additionally, the EDX measurement shows a Co distribution of bar-shaped primary particle, from which it can be seen that Co concentration is measured as being higher at the periphery of the bar-shaped primary particle.

<Experimental Example> Concentration Scanning

Figure 10:
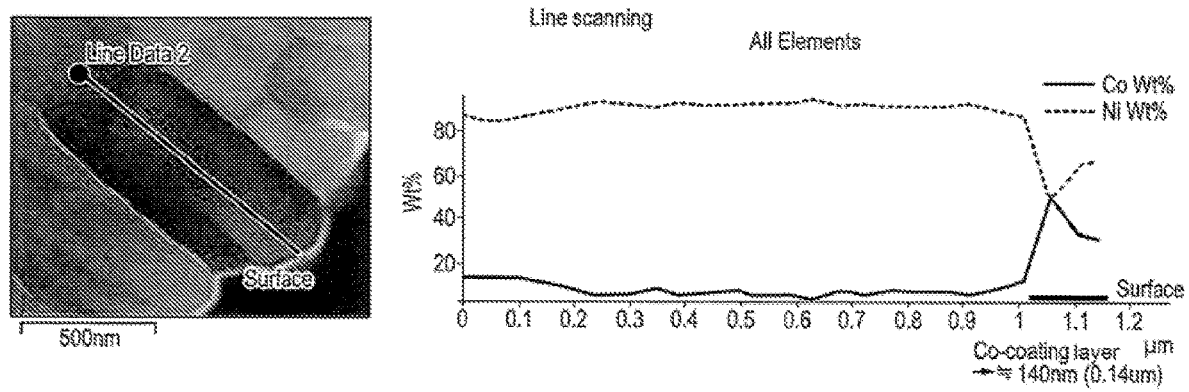
FIG. 10 shows a result of measuring respective variations of concentration for Ni, Co, and Al toward the center from the surface of a positive active material prepared according to an embodiment of the inventive concept.

FIG. 10 shows a result of measuring respective concentration variations of No, Co, and Al from the surface of a secondary particle of the positive active material, which is manufactured through Embodiment 4, toward the center of the particle.

From FIG. 10, it can be seen that the positive active material manufactured through Embodiment 4 of the inventive concept has Co concentration that becomes higher toward the center from the surface in the Co-coated layer where Co is coated, but after the Co-coated layer, the Co concentration turns to be reduced as close as the center and a thickness of the Co-coated layer is 0.14 μm.

<Experimental Example> Concentration Scanning

Figure 11:
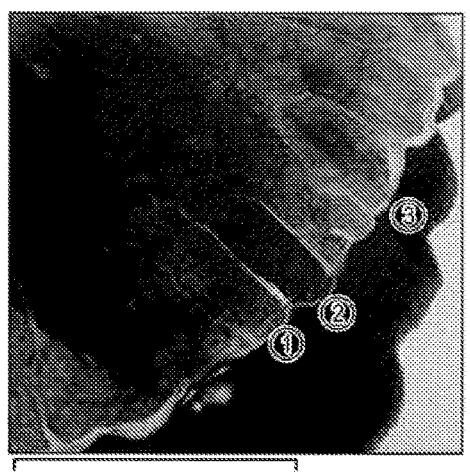
FIG. 11 shows a result of measuring respective variations of concentration for Ni, Co, and Al toward the center from a third spot of a positive active material prepared according to an embodiment of the inventive concept.
Figure 11:
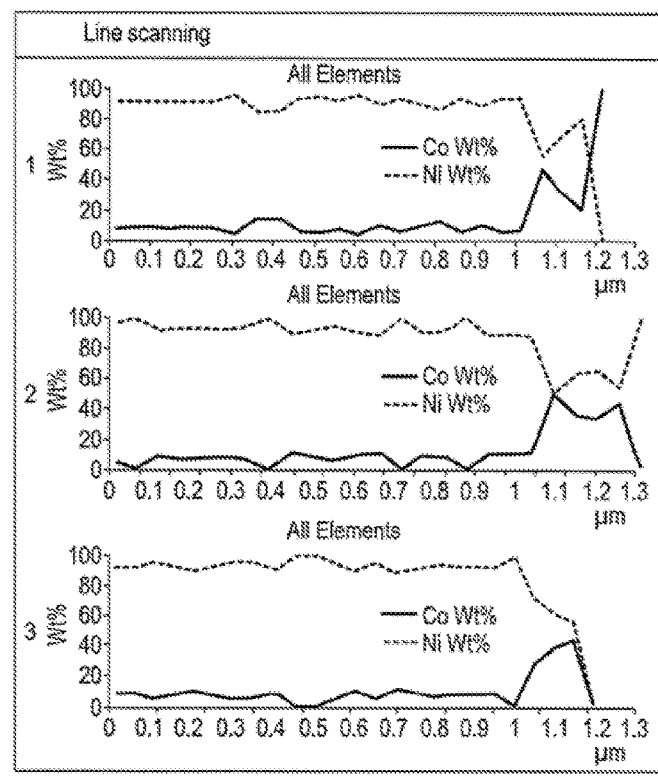

FIG. 11 shows a result of measuring respective concentration variations of No, Co, and Al from three spots on the surface of a secondary particle of the positive active material, which is manufactured through Embodiment 4, toward the center of the secondary particle.

From FIG. 11, it can be seen that three independent spots on the surface of the secondary particle of the positive active material manufactured through Embodiment 4 have thicknesses of 0.14 μm that forms a uniform grade therein.

<Experimental Example> Measuring Distances Between Crystalline Structures

Figure 12:
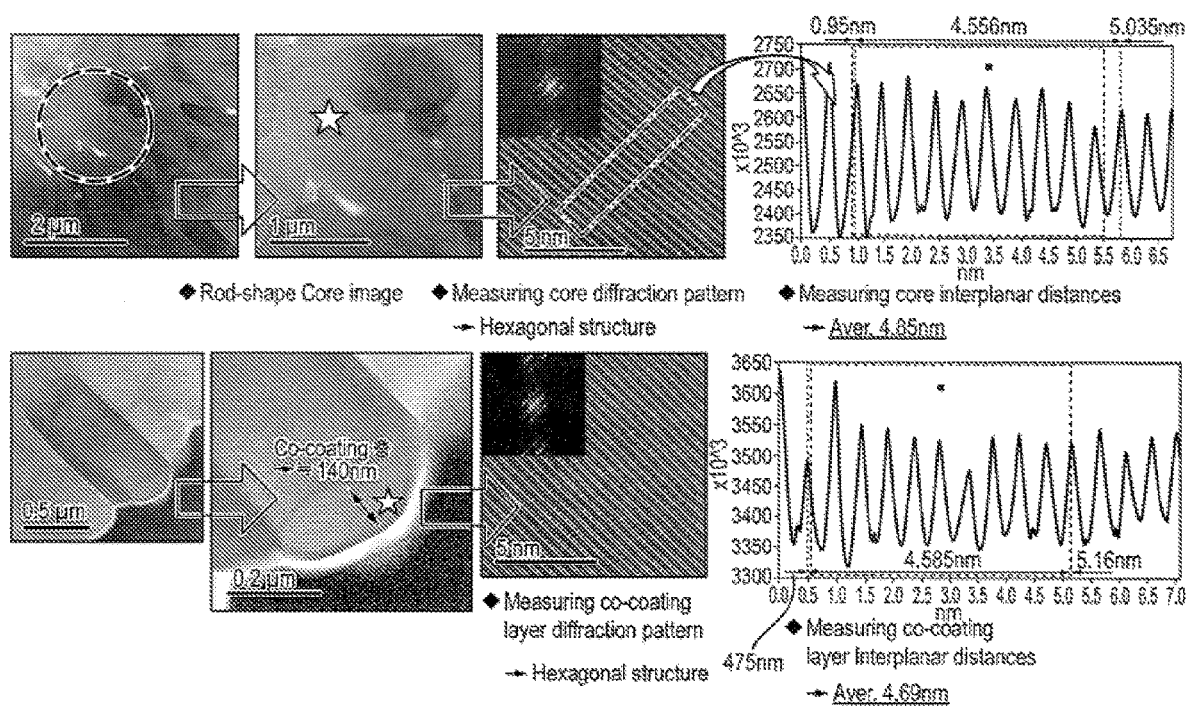
FIGS. 12 to 14 show results of measuring diffraction patterns and interplanar distances of positive active materials manufactured by comparison examples and embodiments of the inventive concept.

FIG. 12 shows a result of measuring respective diffraction patterns and interplanar distances of primary particle locating in the internal part of a secondary particle of the positive active material manufactured through Embodiment 4 and locating on the surface where Co and Ti are coated.

As shown in FIG. 12, it was measured that a thickness of the Co-coated layer was about 140 nm, a diffraction pattern of the primary particle locating in a secondary particle was in a hexagonal structure, and interplanar distance of the primary particle locating in the secondary particle was measured as 4.85 nm, while the primary particle locating on the surface part, which was coated with Co and Ti, had a diffraction pattern of hexagonal structure but its interplanar distance thereof was measured as 4.69 nm.

It can be seen that, comparative to the primary particle locating in the Co-uncoated secondary particle, the interplanar distance of the primary particle locating on the Co-coated surface was reduced and changed similar to the interplanar distance of $LiCoO_2$ of a comparison example.

Figure 13:
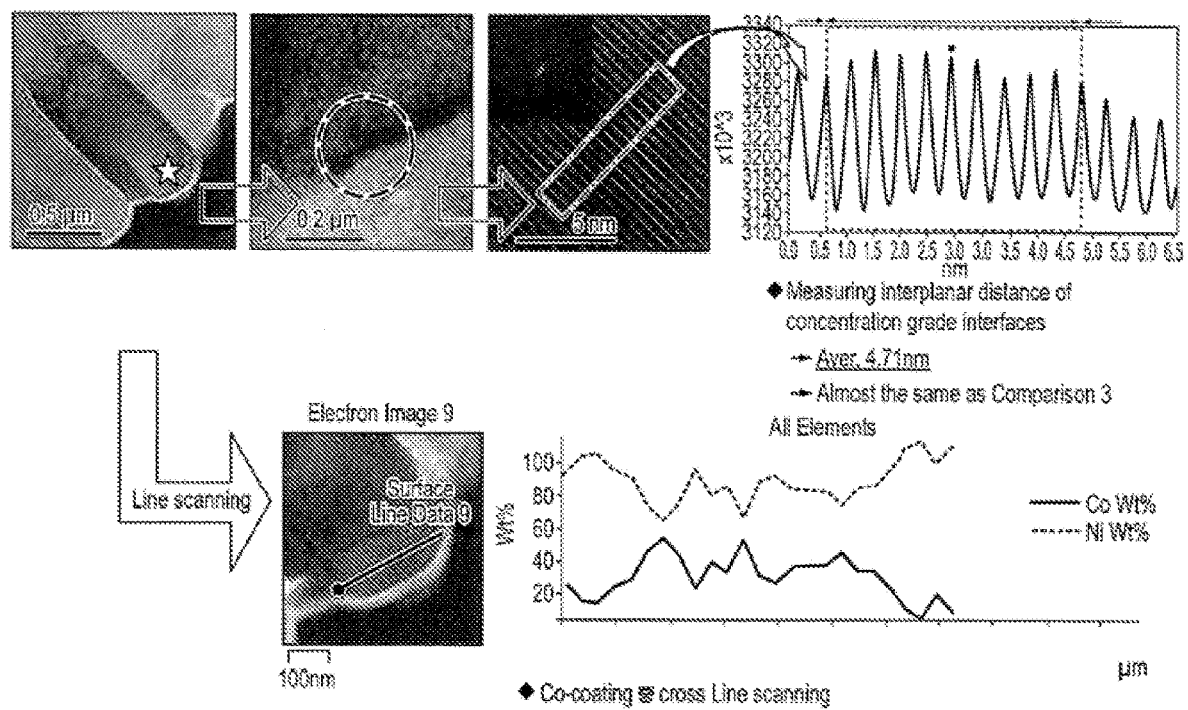

<Experimental Example> Measuring Interplanar Distances Between Crystalline Structures at Coated Layer Boundary FIG. 13 shows a result of measuring a diffraction pattern and interplanar distances from a boundary between the inside of a primary particle, which locates on the surface part of a secondary particle of the positive active material manufactured through Embodiment 4, and a coated layer in the primary particle locating on the surface part of the secondary particle.

As shown in FIG. 13, from the boundary between the inside of the primary particle, which locates on the surface of the secondary particle of the positive active material manufactured through Embodiment 4, and the coated layer, which is coated with Co and Ti, in the primary particle locating on the surface part of the secondary particle, the diffraction pattern was in a hexagonal structure and the interplanar distances were measured as 4.71 nm on average.

It can be seen that, comparative to the primary particle locating in the secondary particle has an interplanar distance of 4.85 nm and the primary particle locating on the surface part of the secondary particle, which is coated with Co and Ti, has an interplanar distance of 4.69 nm, the interplanar distance of the coated layer boundary in the primary particle locating on the surface part of the secondary particle coated with Co and Ti, that is, 4.71 nm, was measured as an intermediate value between the interplanar distance of the primary particle locating in the internal part of secondary particle and the interplanar distance of the primary particle locating on the surface part of the secondary particle which is coated with Co and Ti.

Additionally, it can be seen that the interplanar distance of the primary particle at the coated layer boundary was changed similar to the interplanar distance of $LiCoO_2$ of a comparison example.

Figure 14:
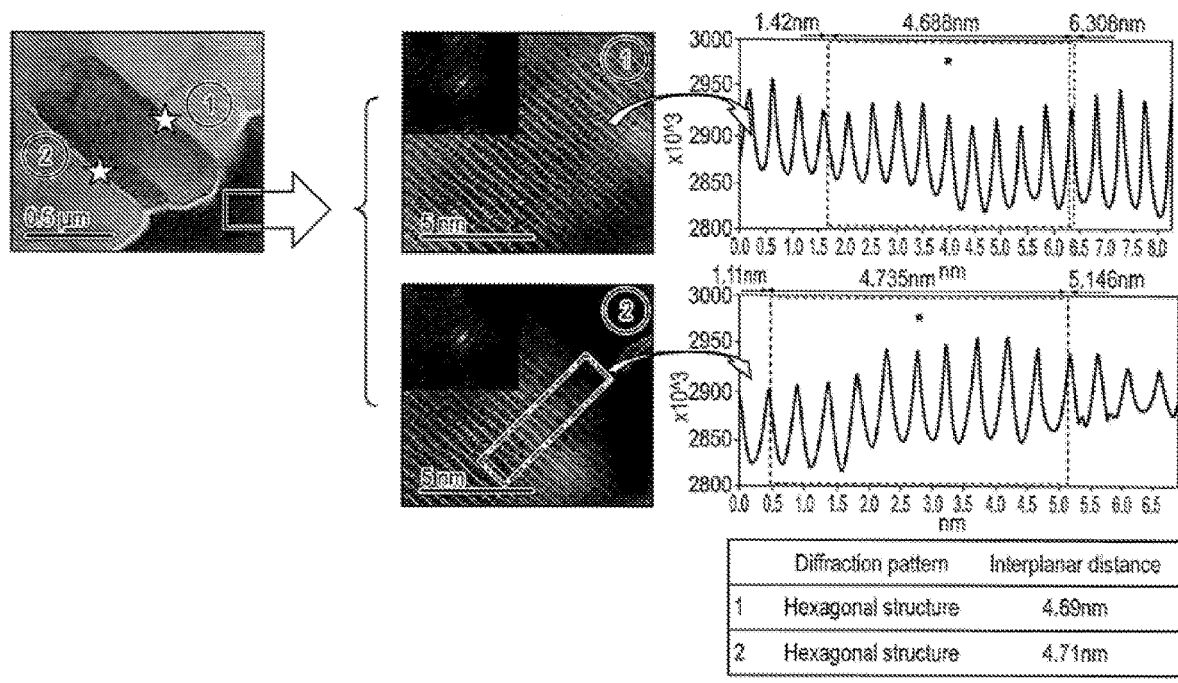

<Experimental Example> Measuring Interplanar Distances Between Crystalline Structures at Boundary of Primary Particle FIG. 14 shows diffraction patterns and interplanar distances at boundaries of a primary particle locating on the surface part of a secondary particle, which is coated with Co and Ti, of the positive active material manufactured through Embodiment 4.

As shown in FIG. 14, from the boundaries of the primary particle locating on the surface part of the secondary particle of the positive active material, the diffraction patterns are in a hexagonal structure and the interplanar distances are measured as 4.69 nm and 4.71 nm as an intermediate value of interplanar distances between a core part and a coated layer part.

Additionally, it can be seen that the interplanar distance of the primary particle at the coated layer boundary was changed similar to the interplanar distance of $LiCoO_2$ of a comparison example.

<Embodiment 5> Manufacturing Positive Active Material

In the same manner with Embodiment 1, a positive active material of Embodiment 5 was manufactured by manufacturing a lithium secondary battery positive active material, which had been processed through the first thermal treatment, in the composition of $Li_{1.02}Ni_{0.816}Co_{0.15}Al_{0.034}O_2$ without addition of Ti.

<Embodiment 6> Manufacturing Positive Active Material

In the same manner with Embodiment 1, a positive active material of Embodiment 6 was manufactured by manufacturing a lithium secondary battery positive active material, which had been processed through the first thermal treatment, in the composition of $Li_{1.02}Ni_{0.903}Co_{0.08}Al_{0.014}Mg_{0.003}O_2$.

<Embodiment 7> Manufacturing Positive Active Material

In the same manner with Embodiment 1, a positive active material of Embodiment 7 was manufactured by manufacturing a lithium secondary battery positive active material, which had been processed through the first thermal treatment, in the composition of $Li_{1.00}Ni_{0.965}Co_{0.02}Al_{0.014}Mg_{0.001}O_2$.

<Embodiment 8> Manufacturing Positive Active Material

In the same manner with Embodiment 7, a positive active material of Embodiment 8 was manufactured by executing a coating process with 4 mol % concentration of a cobalt solution which was added to the positive active material washing liquid.

<Embodiment 9> Manufacturing Positive Active Material

In the same manner with Embodiment 7, a positive active material of Embodiment 9 was manufactured by executing a coating process with 5 mol % concentration of a cobalt solution which was added to the positive active material washing liquid.

<Embodiment 10> Manufacturing Positive Active Material

In the same manner with Embodiment 7, a positive active material of Embodiment 10 was manufactured by manufacturing a lithium secondary battery positive active material, which had been processed through the first thermal treatment, in the composition of $Li_{1.00}Ni_{0.985}Al_{0.014}Mg_{0.001}O_2$.

The final formulas of compositions used in Embodiments 1 to 10 are summarized in Table 1 as follows.

TABLE 1

| | Final Composition Formula |
|---|---|
| | $Li_{X1}Ni_{1-(x1+y1+z1)}Co_{x1}M1_{y1}M2_{z1}M3_{r1}O_a$ |
| Embodiment 1 | $Li_{1.01}Ni_{0.903}Co_{0.08}Al_{0.015}Mg_{0.001}Ti_{0.001}O_2$ |
| Embodiment 2 | $Li_{1.01}Ni_{0.893}Co_{0.09}Al_{0.015}Mg_{0.001}Ti_{0.001}O_2$ |
| Embodiment 3 | $Li_{1.02}Ni_{0.883}Co_{0.10}Al_{0.015}Mg_{0.001}Ti_{0.001}O_2$ |
| Embodiment 4 | $Li_{1.02}Ni_{0.833}Co_{0.10}Al_{0.015}Mg_{0.001}Ti_{0.001}O_2$ |
| Embodiment 5 | $Li_{1.02}Ni_{0.786}Co_{0.18}Al_{0.034}O_2$ |
| Embodiment 6 | $Li_{1.02}Ni_{0.873}Co_{0.11}Al_{0.015}Mg_{0.001}Ti_{0.001}O_2$ |
| Embodiment 7 | $Li_{1.00}Ni_{0.933}Co_{0.05}Al_{0.015}Mg_{0.001}Ti_{0.001}O_2$ |
| Embodiment 8 | $Li_{1.00}Ni_{0.923}Co_{0.06}Al_{0.015}Mg_{0.001}Ti_{0.001}O_2$ |
| Embodiment 9 | $Li_{1.00}Ni_{0.913}Co_{0.07}Al_{0.015}Mg_{0.001}Ti_{0.001}O_2$ |
| Embodiment 10 | $Li_{1.00}Ni_{0.953}Co_{0.03}Al_{0.015}Mg_{0.001}Ti_{0.001}O_2$ |

<Comparison 2>
In the same manner with Embodiment 4, a positive active material of Comparison 2 was manufactured by injecting active material particles into a 0.1 mol cobalt solution, coating the active material with cobalt while agitating the mixture, and drying the coated material.

<Comparison 3>
In the same manner with Embodiment 4, a positive active material of Comparison 3 was manufactured, without including Co during a washing process, by excluding a Ti adding process and a second thermal treatment.

<Experimental Example> Measuring TEM and TDX

Figure 15:
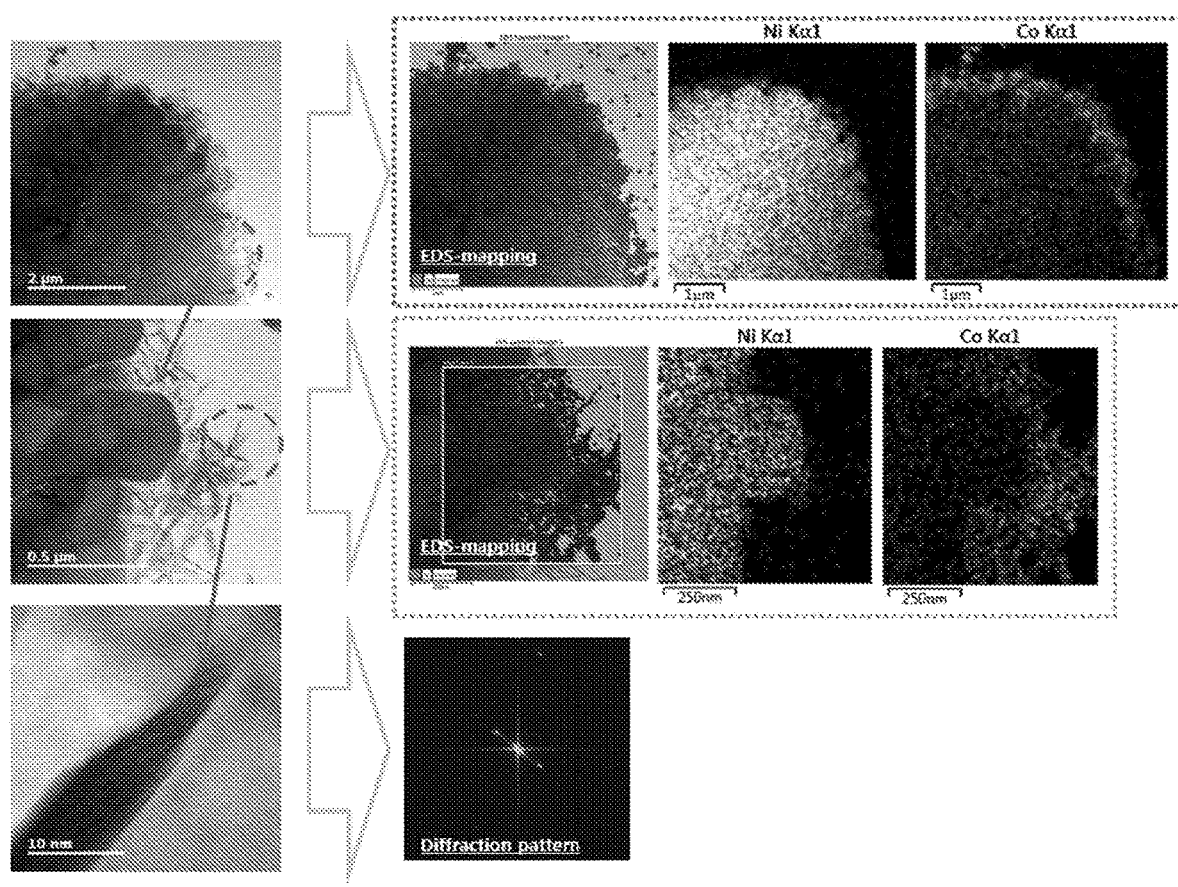
FIGS. 15 and 16 show results of measuring EDX photographs of positive active materials manufactured by comparison examples of the inventive concept.

FIG. 15 shows a result of measuring TEM and EDX photographs from the surface of a secondary particle of the positive active material manufactured through Comparison 2.

As shown in FIG. 15, it can be seen that the positive active material resulted in an uneven surface, without being doped into the inside, because there was no subsequent thermal treatment even though the Co distribution was concentrated on the surface due to the agitation with the active material particles which were injected into the cobalt solution.

<Comparison 4>
In the same manner with Comparison 3, a positive active material of Comparison 4 was manufactured by adding Ti with concentration of 0.001 mol and then executing a second thermal treatment.

<Comparison 5>
In the same manner with Comparison 3, a positive active material of Comparison 5 was prepared, without a washing process, after manufacturing a lithium secondary battery positive active material which had been processed through a first thermal treatment.

<Comparison 6>
In the same manner with Comparison 3, a positive active material of Comparison 6 was prepared by manufacturing a lithium secondary battery positive active material, which had been processed through a first thermal treatment, in the composition of $Li_{1.00}Ni_{0.815}Co_{0.15}Al_{0.014}O_2$.

<Comparison 7>
In the same manner with Comparison 4, a positive active material of Comparison 7 was prepared by manufacturing a lithium secondary battery positive active material, which had been processed through a first thermal treatment, in the composition of $Li_{1.02}Ni_{0.903}Co_{0.08}Al_{0.014}Mg_{0.003}O_2$.

<Comparison 8>
In the same manner with Comparison 4, a positive active material of Comparison 8 was prepared by manufacturing a lithium secondary battery positive active material, which had been processed through a first thermal treatment, in the composition of $Li_{1.00}Ni_{0.965}Co_{0.02}Al_{0.014}Mg_{0.001}O_2$.

<Comparison 9>
In the same manner with Comparison 4, a positive active material of Comparison 9 was prepared by manufacturing a lithium secondary battery positive active material, which had been processed through a first thermal treatment, in the composition of $Li_{1.00}Ni_{0.985}Al_{0.014}Mg_{0.001}O_2$.

The final formulas of compositions used in Comparisons 1 to 9 are summarized in Table 2 as follows.

The final formulas of compositions for the first baking processes of Comparisons 1 to 9 are summarized in Table 2 as follows.

TABLE 2

| | Final Composition Formula |
|---|---|
| | $Li_{X1}Ni_{1-(x1+y1+z1)}Co_{x1}M1_{y1}M2_{z1}M3_{r1}O_a$ |
| Comparison 1 | $LiCoO_2$ |
| Comparison 2 | Washed and dried product of Embodiment 4 |
| Comparison 3 | Washed and dried product of Comparison 4 |
| Comparison 4 | $Li_{1.00}Ni_{0.933}Co_{0.05}Al_{0.015}Mg_{0.001}Ti_{0.001}O_2$ |
| Comparison 5 | $Li_{1.05}Ni_{0.934}Co_{0.05}Al_{0.015}Mg_{0.001}Ti_{0.001}O_2$ (Unwashed product) |
| Comparison 6 | $Li_{1.00}Ni_{0.815}Co_{0.15}Al_{0.035}O_2$ |
| Comparison 7 | $Li_{1.02}Ni_{0.903}Co_{0.08}Al_{0.015}Mg_{0.001}Ti_{0.001}O_2$ |

TABLE 2-continued

Final Composition Formula

| Comparison 8 | $Li_{1.00}Ni_{0.963}Co_{0.02}Al_{0.015}Mg_{0.001}Ti_{0.001}O_2$ |
| Comparison 9 | $Li_{1.00}Ni_{0.983}Co_{0.05}Al_{0.015}Mg_{0.001}Ti_{0.001}O_2$ |

<Experimental Example> Measuring TEM and TDX

Figure 16:
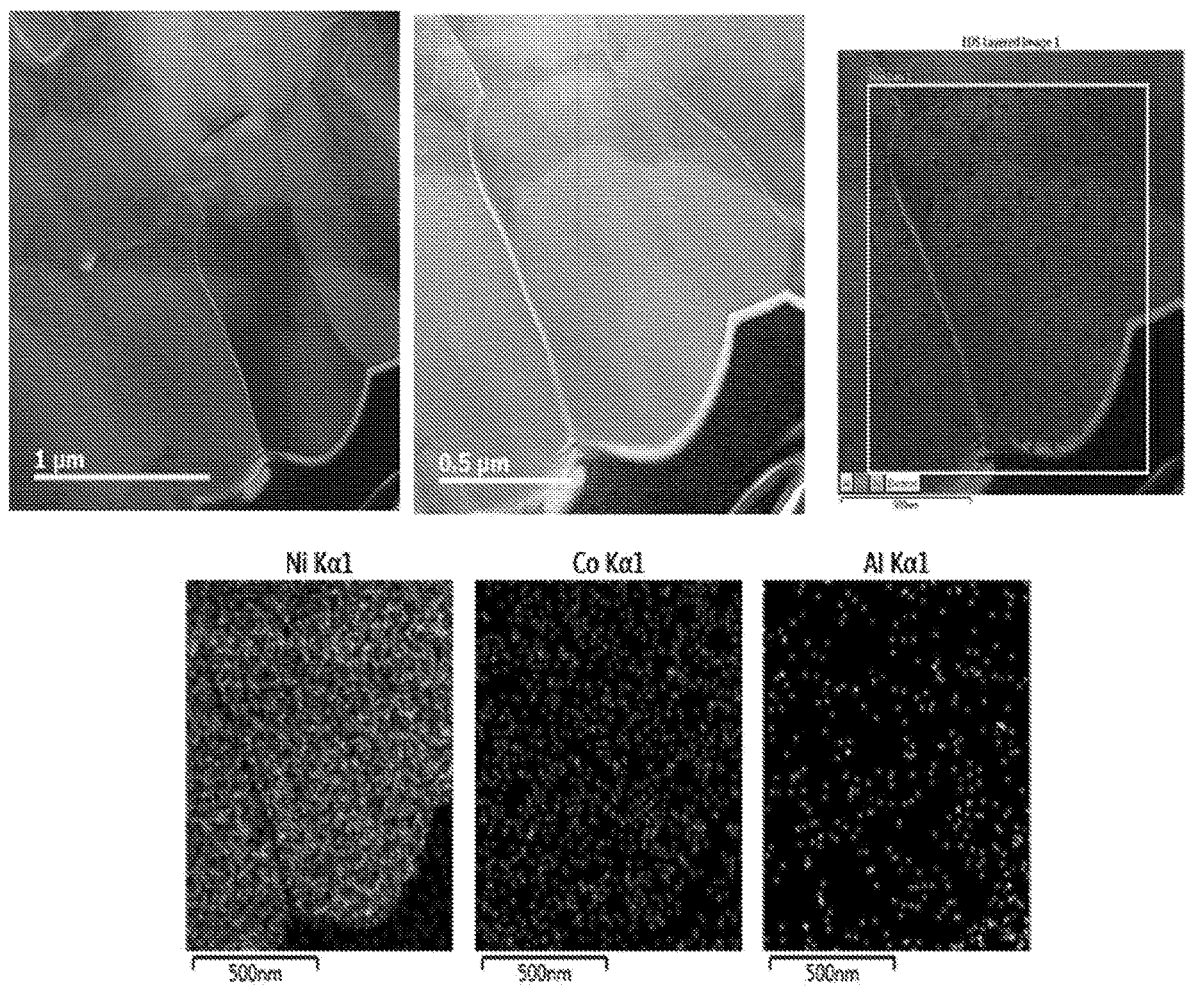

FIG. 16 shows a result of measuring TEM and EDX photographs from the surface of a secondary particle of the positive active material manufactured through Comparison 4.

As shown in FIG. 16, it can be seen that the positive active material manufactured through Comparison 4 has Co concentration uniformly distributed in the particle, because a Co coating process is not preformed after manufacturing an active material, and a Co concentration grade toward the inside of the particle is not found on the surface.

<Experimental Example> Measuring Distances Between Crystalline Structures

Figure 17:
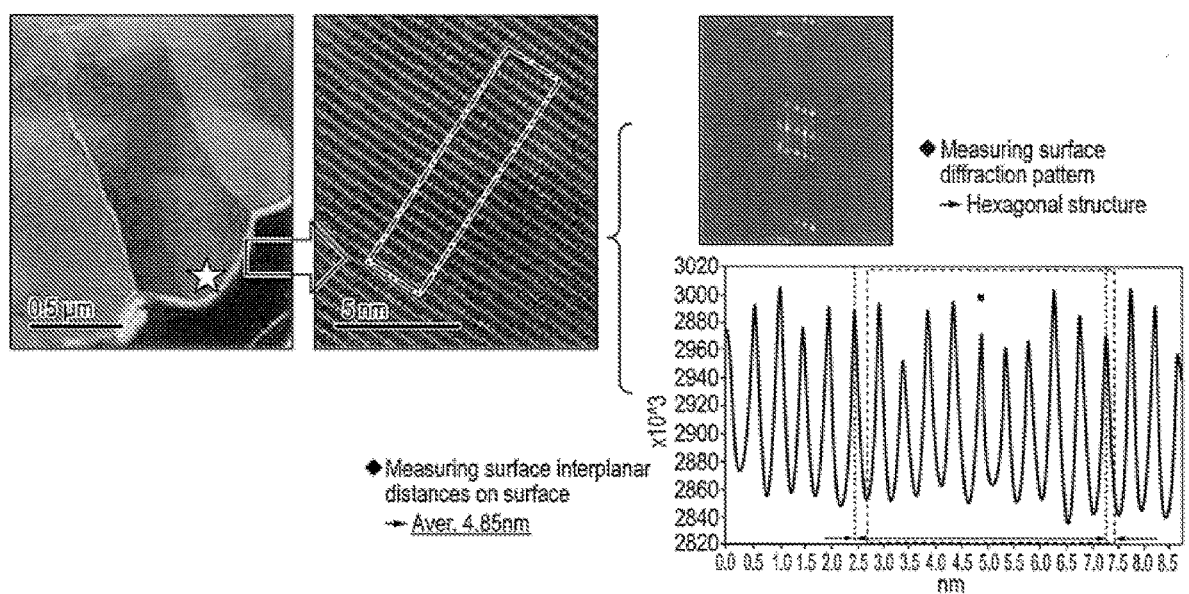
FIGS. 17 to 19 show results of measuring diffraction patterns and interplanar distances of positive active materials manufactured by comparison examples and embodiments of the inventive concept.

FIG. 17 shows a result of measuring respective a diffraction pattern and interplanar distances from the surface of a secondary particle of the positive active material manufactured through Embodiment 4.

As shown in FIG. 17, a diffraction pattern of the surface was in a hexagonal structure and the interplanar distances were measured as 4.85 nm on average.

Figure 18:
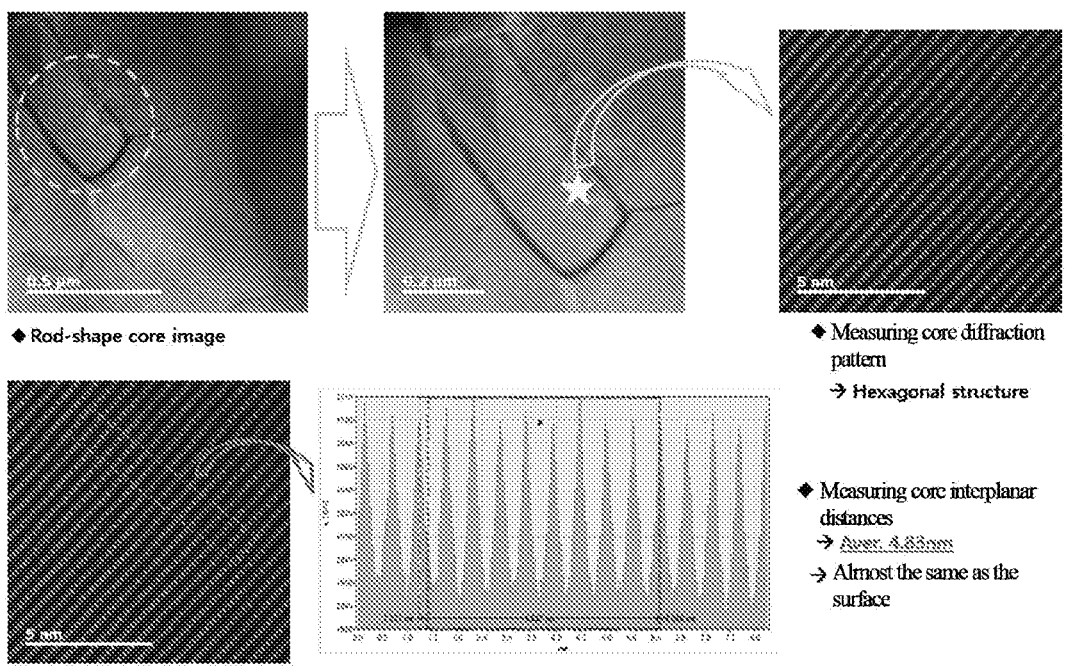

FIG. 18 shows a result of measuring a diffraction pattern and interplanar distances of a primary particle locating in a secondary particle of the positive active material manufactured through Comparison 4.

As shown in FIG. 18, it can be seen that the primary particle locating in the secondary particle of the positive active material has a diffraction pattern of hexagonal structure and interplanar distances of 4.83 nm on average. It can be also seen that, even with a second thermal treatment in the case without a Co coating process, the interplanar distance of the primary particle locating in the secondary particle of the positive active material is almost similar to that of a primary particle locating on the surface part of the secondary particle.

Figure 19:
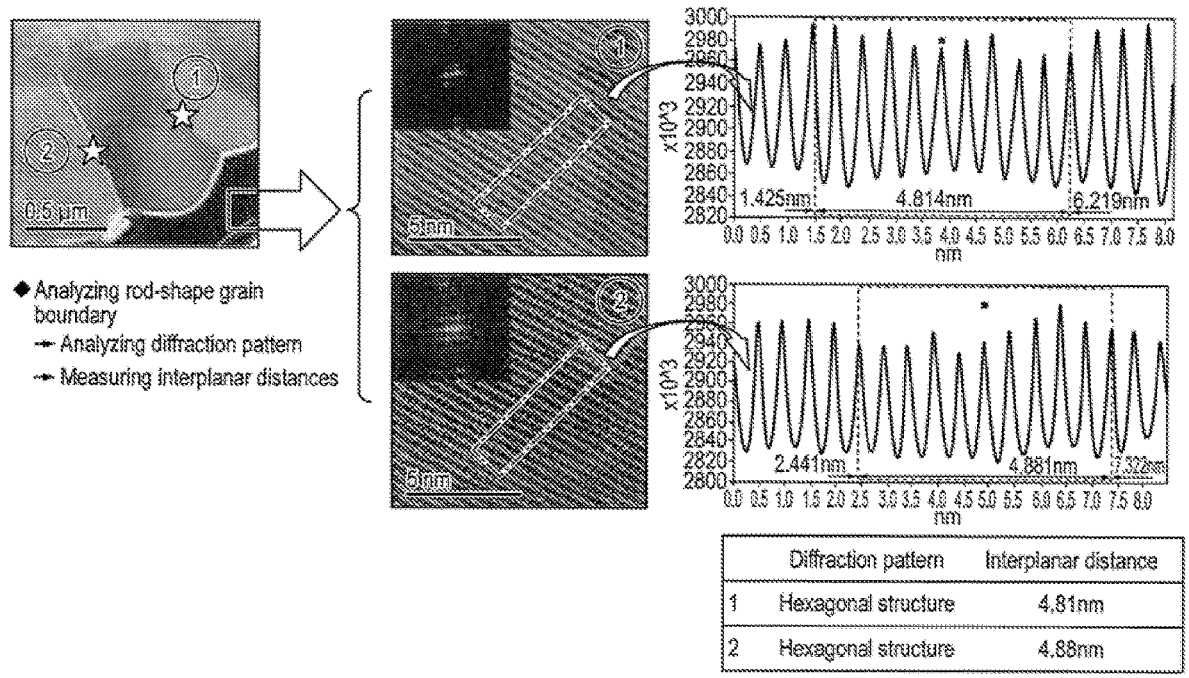

<Experimental Example> Measuring Interplanar Distances Between Crystalline Structures at Primary Particle Boundary FIG. 19 shows a result of measuring diffraction patterns and interplanar distances from a boundary of a primary particle locating on the surface part of a secondary particle of the positive active material manufactured through Embodiment 4.

As shown in FIG. 19, the primary particle locating on the surface part of the secondary particle of the positive active material was measured as having a diffraction pattern of hexagonal structure and interplanar distances of 4.81 nm on average.

Additionally, it can be seen from FIGS. 18 and 19 that, in the case without a Co coating process, diffraction patterns and interplanar distances are similar between the inside and the boundary of the primary particle.

<Experimental Example> Concentration Scanning

Figure 20:
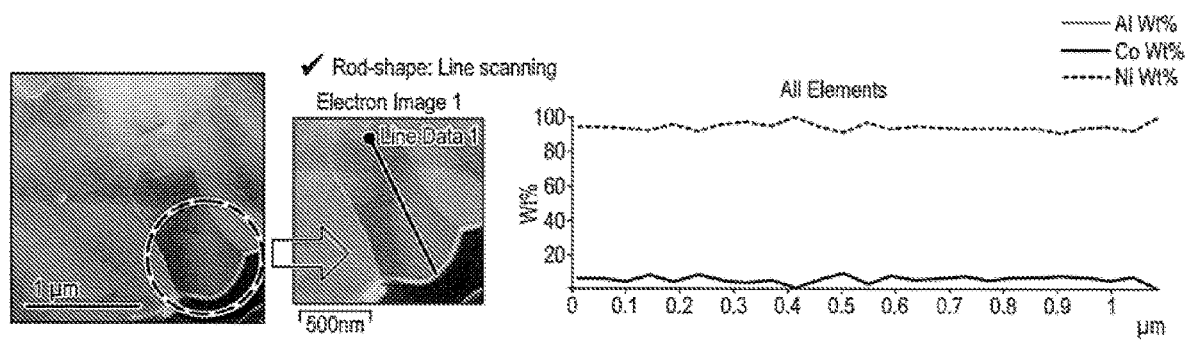
FIGS. 20 and 21 show results of measuring respective variations of concentration for Ni, Co, and Al toward the center from the surface of a positive active material prepared according to an embodiment of the inventive concept.

FIG. 20 shows a result of measuring respective concentration of Ni, Co, and Al toward the core from the surface of a secondary particle of the positive active material manufactured through Comparison 4.

From FIG. 20, it can be seen that the positive active material manufactured through Comparison 4 has uniform concentration of Ni, Co, and Al in the particle.

<Experimental Example> Concentration Scanning

Figure 21:
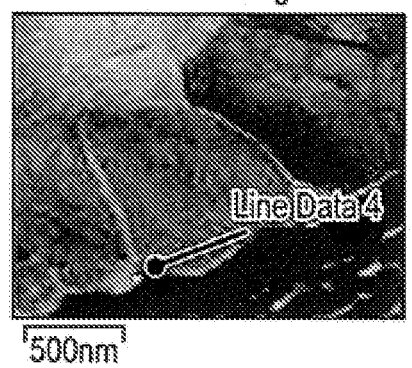
Figure 21:
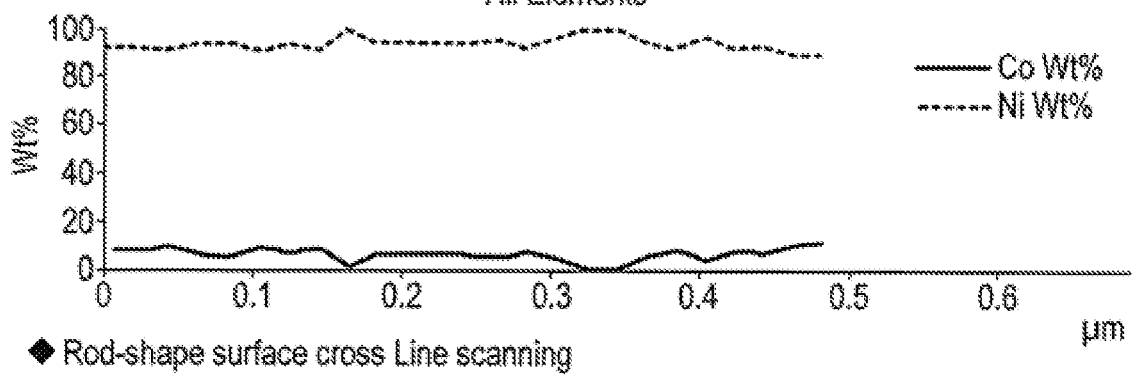

FIG. 21 shows a result of measuring respective concentration of Ni, Co, and Al in a direction horizontal to the surface direction of a primary particle locating on the surface part of a secondary particle of the positive active material manufactured through Comparison 4.

From FIG. 21, it can be seen that the positive active material manufactured through Comparison 4 has uniform concentration of Ni, Co, and Al in the particle, without a Co concentration grade due to absence of a CO coating process, and interplanar distances thereof are also similar between the surface and the inside.

<Experimental Example> Measuring XRD

Figure 22:
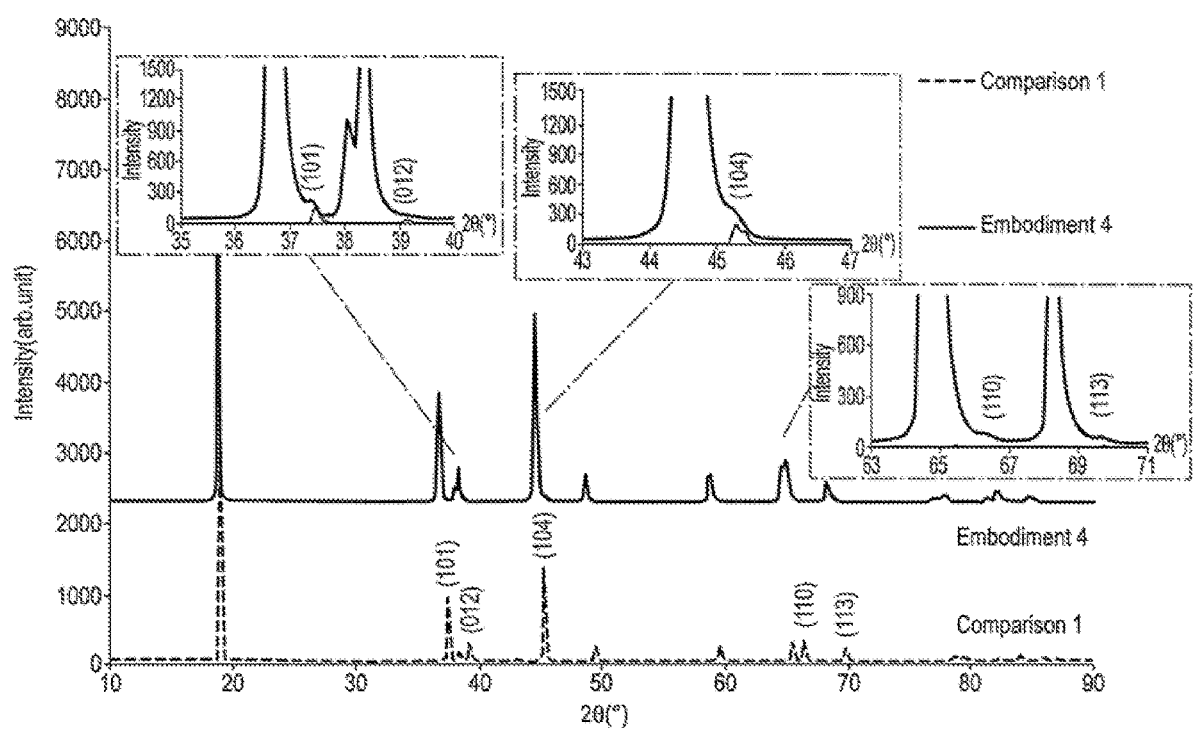
FIGS. 22 to 25 show results of measuring XRD of positive active materials manufactured by comparison examples and embodiments of the inventive concept.
Figure 23:
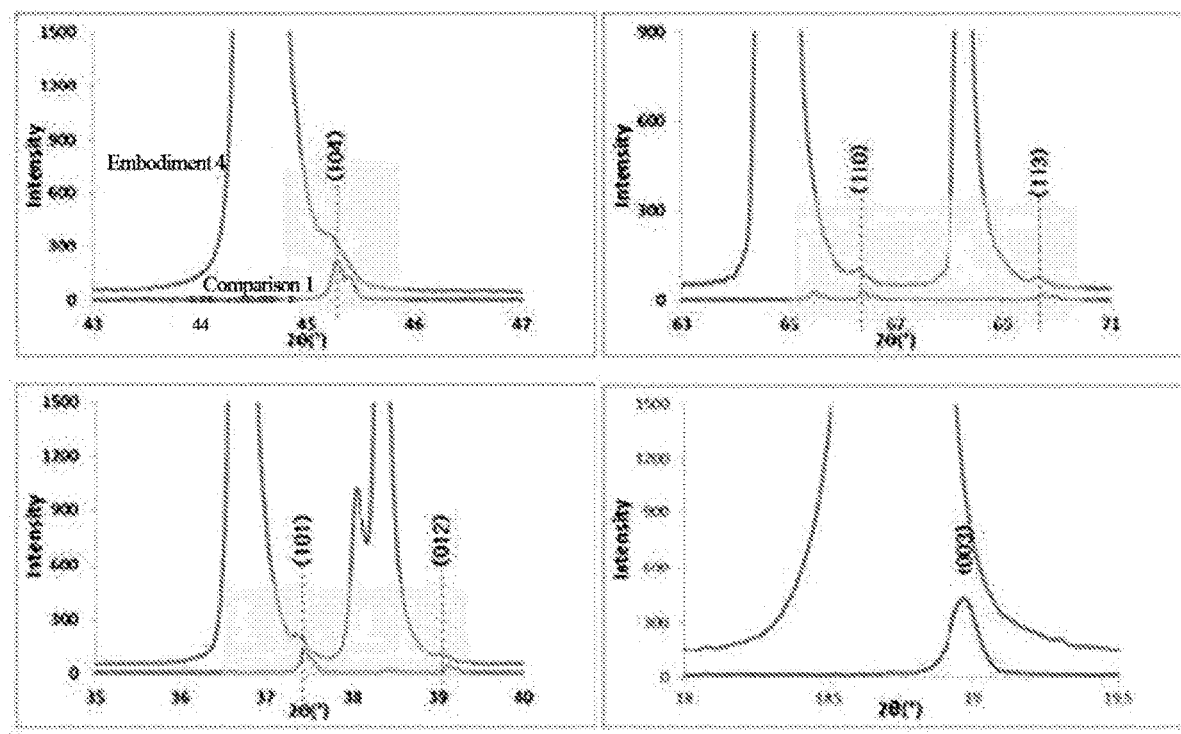

Results of measuring XRD for $LiCoO_2$ positive active materials of Embodiment 4 and Comparison 1 are shown in FIGS. 22 and 23.

As shown in FIGS. 22 and 23, it can be seen that a Co and Ti coated positive active material, which is manufactured through Embodiment 4 of the inventive concept, is detected with peaks of (104), (110), (113), (101), (102), and (003) as like the case of $LiCoO_2$ of Comparison 1.

<Experimental Example> Measuring XRD

Figure 24:
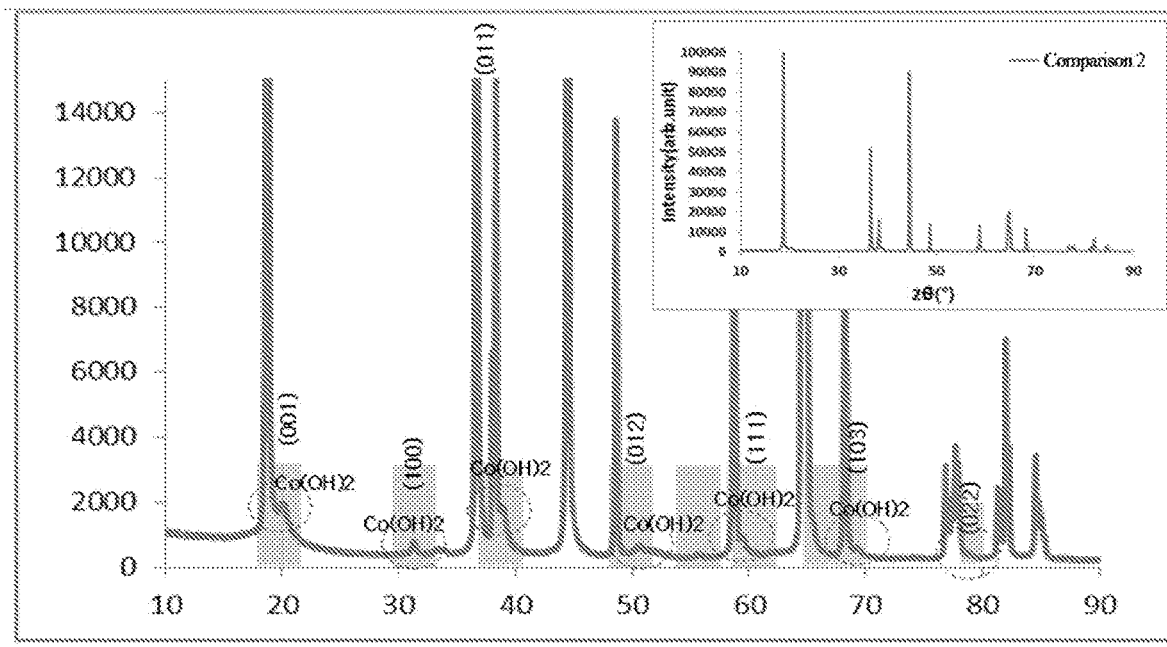

A result of measuring XRD for a positive active material of Comparison 2 is shown in FIG. 24.

As shown in FIG. 24, it can be seen that the positive active material manufactured through Comparison 2 of the inventive concept is detected only with a peak by $Co(OH)_2$ but there are no detection with peaks of (104), (110), (113), (101), (102), and (003).

<Experimental Example> Measuring XRD

Figure 25:
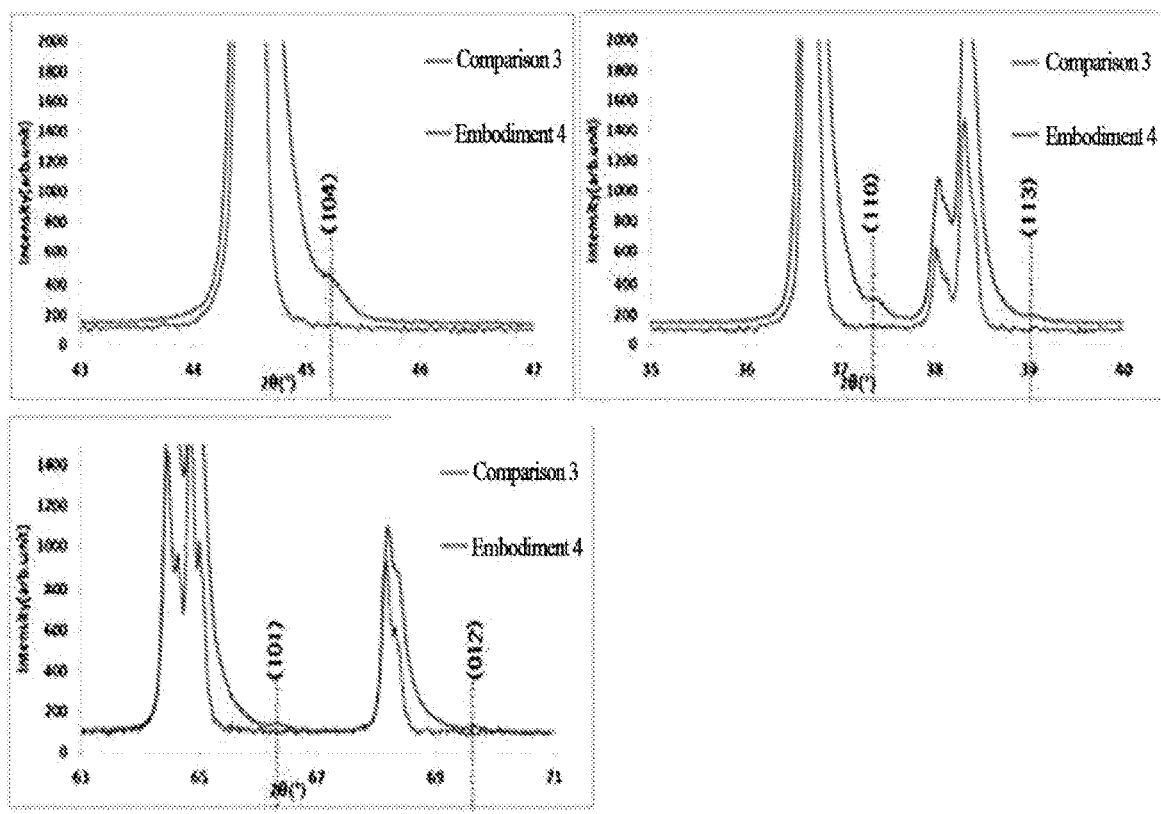

FIG. 25 shows a result of measuring XRD for positive active materials manufactured through Comparison 4, which does not execute a Co coating process, and through Embodiment 4 executing a thermal treatment after a Co coating process.

As shown in FIG. 25, it can be seen that the positive active material manufactured through Comparison 4, which does not execute the Co coating process of the inventive concept, is not detected with peaks of (104), (110), (113), (101), (102), and (003) that are distinctly detected from $LiCoO_2$.

<Experimental Example> Measuring XPS

Figure 26:
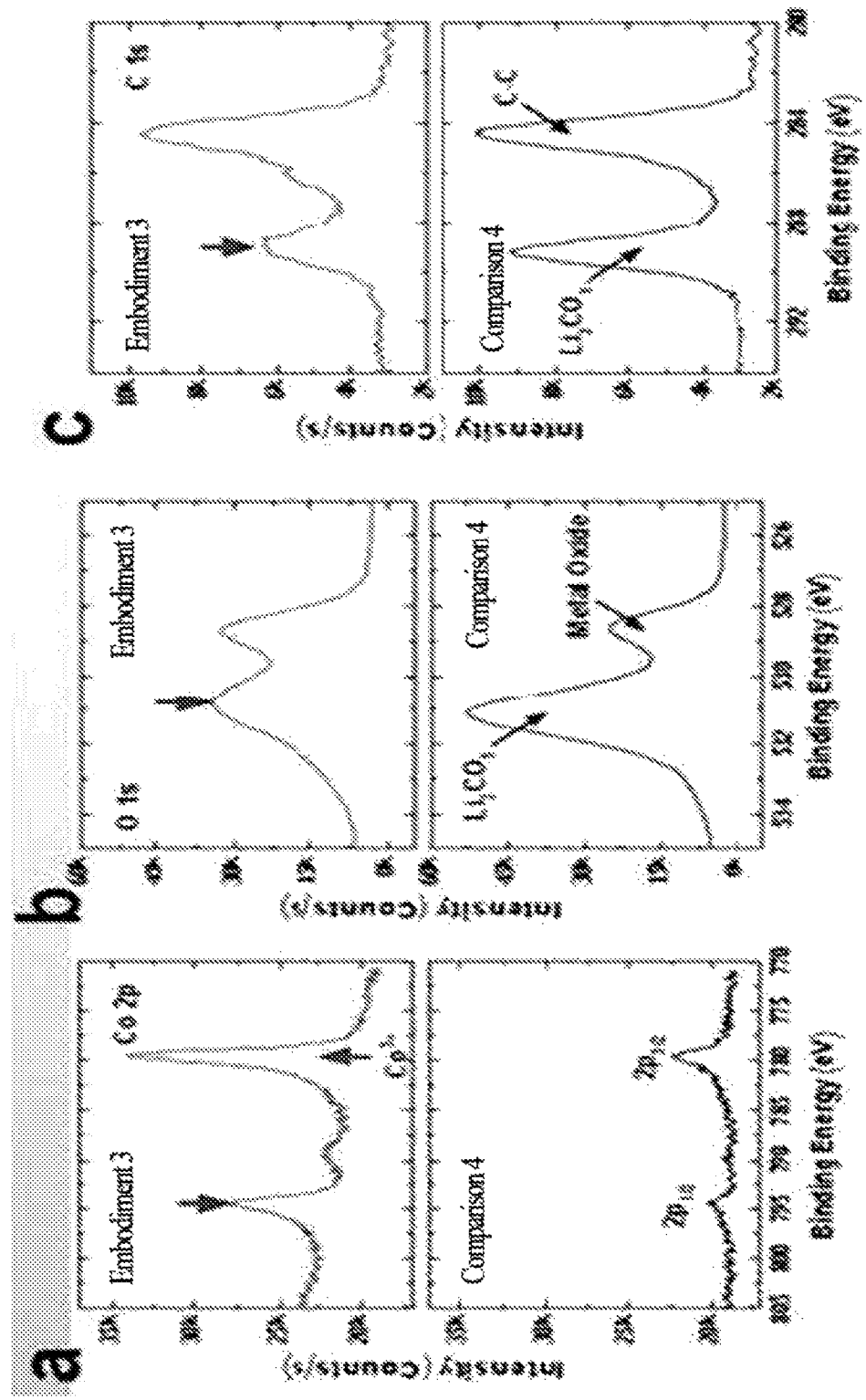
FIG. 26 shows a result of measuring XPS of positive active materials manufactured by a comparison example and an embodiment of the inventive concept.

FIG. 26 shows results of measuring XPS for positive active materials manufactured through Comparison 4, which does not execute a Co coating process, and through Embodiment 3 executing a coating process with a cobalt solution having concentration of 5 mol %.

As shown in FIG. 26, it can be seen that, in the case of coating cobalt during a washing process according to the inventive concept, the Co 2p peak intensity is larger, almost due to Co+3, than that of Comparison 4. Additionally, it can be also seen that the peak intensity by $Li_2CO_3$ is more reduced than that of Comparison 4.

<Experimental Example> Measuring Residual Lithium

A result of measuring amounts of residual lithium from composite oxides manufactured through Embodiments 1 to 10 and Comparisons 4 to 9 is summarized in Table 3 as follows.

To measure residual lithium, an active material of 1 g was precipitated in distilled water of 5 g and agitated for 5 minutes. Next, filtrate was taken after the agitation and titration was executed with HCL of 0.1 M. Then, the residual lithium was analyzed by measuring a volume of the HCL until pH of the filtrate reaches 5.

From Table 3, it can be seen that active materials manufactured through embodiments of the inventive concept have residual lithium which is greatly reduced relative to the case as like as Comparison 5 that does not execute a baking process.

TABLE 3

| | Residual Lithium (ppm) | | |
|---|---|---|---|
| | LiOH | $Li_2CO_3$ | Total |
| Comparison 4 | 1043 | 1787 | 2830 |
| Comparison 5 | 7516 | 9733 | 17249 |
| Comparison 6 | 2628 | 987 | 3615 |
| Comparison 7 | 1017 | 1686 | 3396 |
| Comparison 8 | 1744 | 1622 | 3366 |
| Comparison 9 | 1856 | 2212 | 4068 |
| Embodiment 1 | 1506 | 1996 | 3502 |
| Embodiment 2 | 1432 | 1971 | 3403 |
| Embodiment 3 | 1562 | 1549 | 3111 |
| Embodiment 4 | 2142 | 2450 | 4592 |
| Embodiment 5 | 2556 | 862 | 3418 |
| Embodiment 6 | 1730 | 1830 | 3560 |
| Embodiment 7 | 1630 | 2166 | 3796 |
| Embodiment 8 | 2035 | 2433 | 4468 |
| Embodiment 9 | 1569 | 2067 | 3636 |
| Embodiment 10 | 2519 | 1881 | 4400 |

<Manufacturing Example> Manufacturing Battery

Slurry was manufactured by mixing the positive active materials, which were manufactured through Embodiments 1 to 10 and Comparisons 4, and 6 to 9, super-P as a conducting agent, and polyvinylidenefluoride (PVdF) as a binding agent in weight ratio of 92:5:3. Then an anode for a lithium secondary battery was manufactured by uniformly coating the slurry on an aluminum foil which has a thickness of 15 μm, and then by drying the slurry-coated aluminum foil at 135° C. under vacuum.

A coin battery was manufactured by using the anode and a lithium foil as the other electrode, using a porous polyethylene film (Celgard 2300 made by Celgard LLC; thickness of 25 μm) as a separator, and using a liquid electrolyte in which LiPF6 with concentration of 1.15 M was dissolved in a solvent in which ethylene carbonate and ethylmethyl carbonate are mixed in a volume ratio of 3:7.

<Experimental Example> Measuring Battery Characteristics—Initial Capacity

Figure 27A:
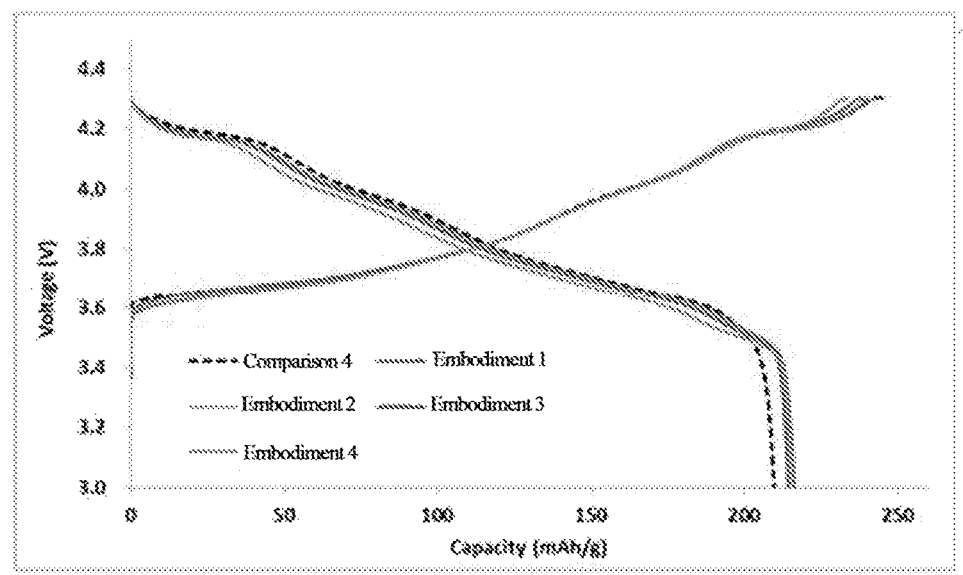
FIGS. 27A to 31E show results of measuring the characteristics of batteries including positive active materials manufactured by comparison examples and embodiments of the inventive concept.
Figure 27B:
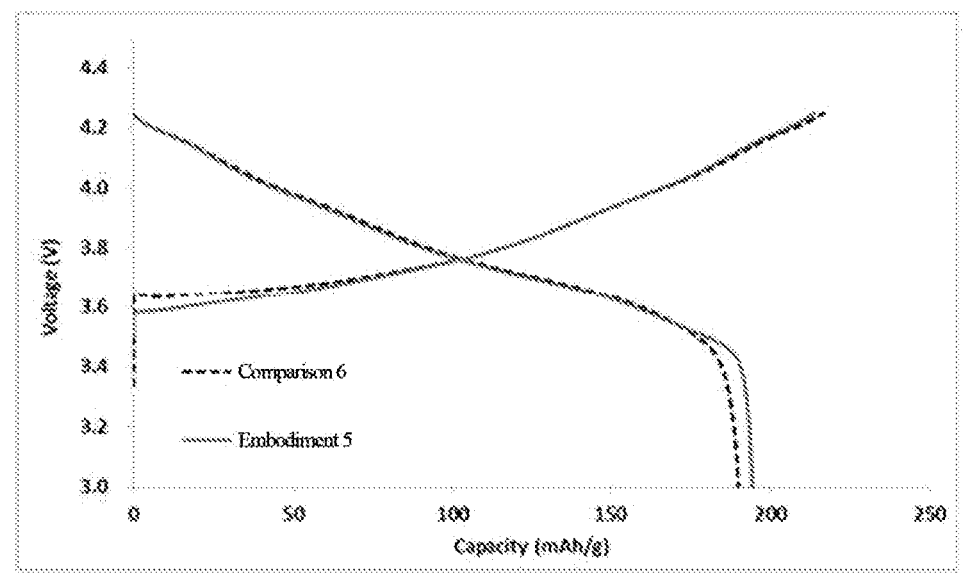
Figure 27C:
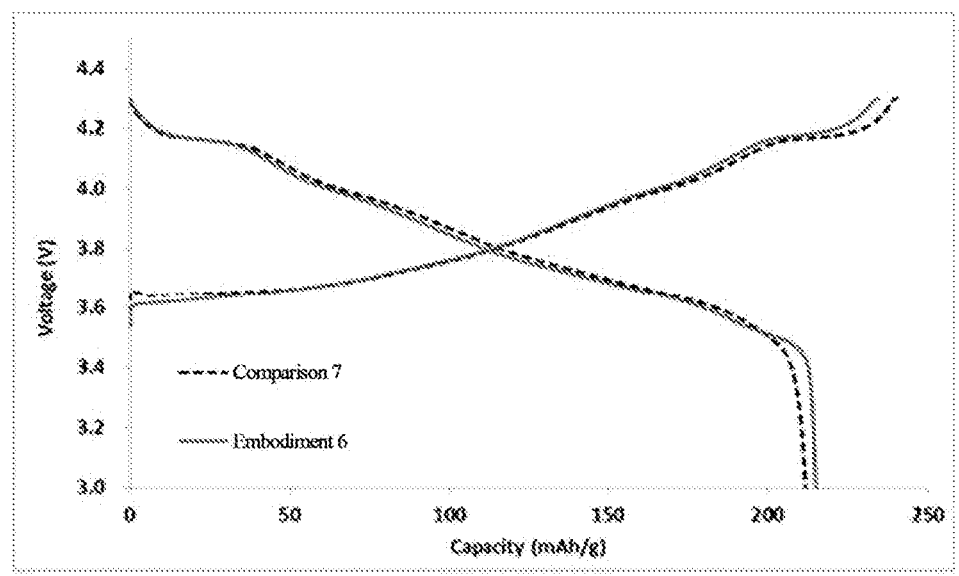
Figure 27D:
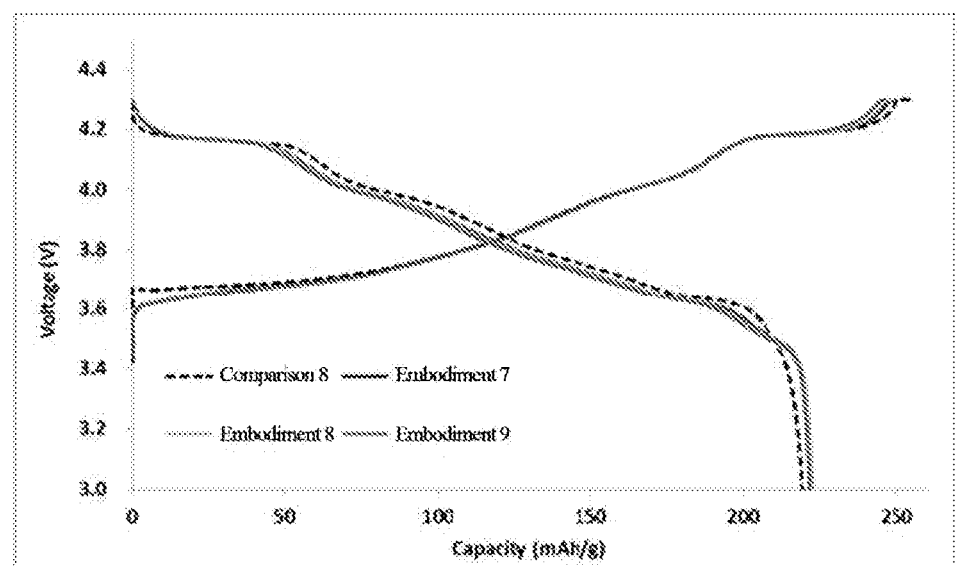
Figure 27E:
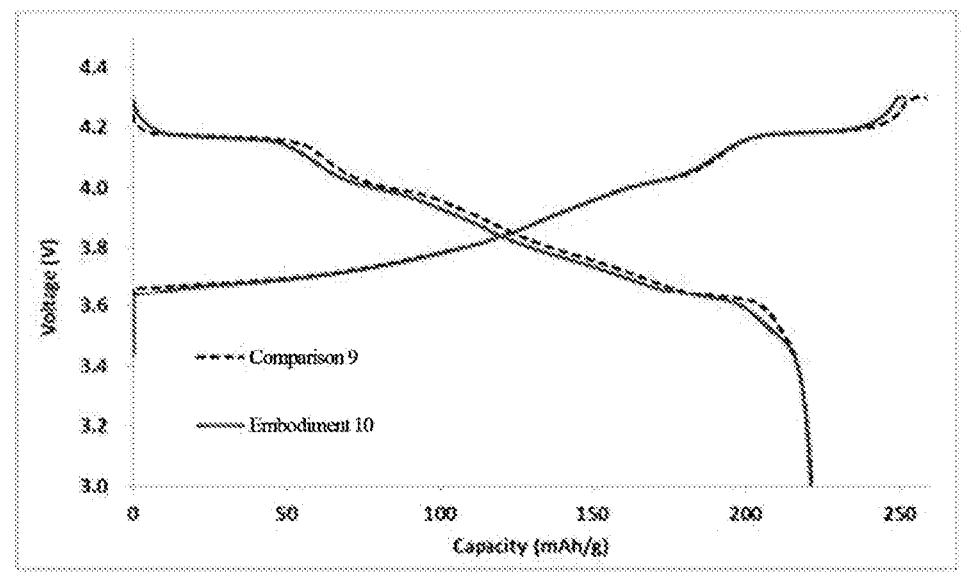

Results of measuring initial capacities of batteries manufactured with active materials manufactured through Embodiments 1 to 10 and Comparisons 4, and 6 to 9 are respectively shown in FIG. 27A (Embodiments 1 to 4, Comparison 4), FIG. 27B (Embodiment 5, Comparison 6), FIG. 27C (Embodiment 6, Comparison 7), FIG. 27D (Embodiments 7 to 9, Comparison 8), and FIG. 27E (Embodiment 10, Comparison 9).

Referring to FIGS. 27A to 27E, the coating process executed according to the embodiments of the inventive concept contributed to the characteristics of capacity and efficiency that was measured as being more improved than that of a comparison examples.

Results of measuring initial capacities of batteries manufactured with active materials manufactured through Embodiments 1 to 10 and Comparisons 4, and 6 to 9 are summarized in Table 4 as follows.

TABLE 4

| | 0.1 C Charge/Discharge | | |
|---|---|---|---|
| | Charge (mAh/g) | Discharge (mAh/g) | 1st Eff. (%) |
| Embodiment 1 | 242.2 | 215.9 | 89.1 |
| Embodiment 2 | 239.9 | 214.4 | 89.4 |
| Embodiment 3 | 239.0 | 215.0 | 90.0 |
| Embodiment 4 | 231.7 | 215.2 | 92.9 |
| Embodiment 5 | 213.9 | 194.1 | 90.8 |
| Embodiment 6 | 232.5 | 213.7 | 91.9 |
| Embodiment 7 | 248.9 | 222.3 | 89.3 |
| Embodiment 8 | 247.2 | 222.5 | 90.0 |
| Embodiment 9 | 245.1 | 220.9 | 90.1 |
| Embodiment 10 | 251.8 | 221.6 | 88.0 |
| Comparison 4 | 244.5 | 209.7 | 85.8 |
| Comparison 6 | 217.1 | 190.2 | 87.6 |
| Comparison 7 | 239.3 | 211.3 | 88.3 |
| Comparison 8 | 255.1 | 219.0 | 85.9 |
| Comparison 9 | 258.2 | 221.6 | 85.8 |

<Experimental Example> Measuring Battery Characteristics—Efficiency

Figure 28A:
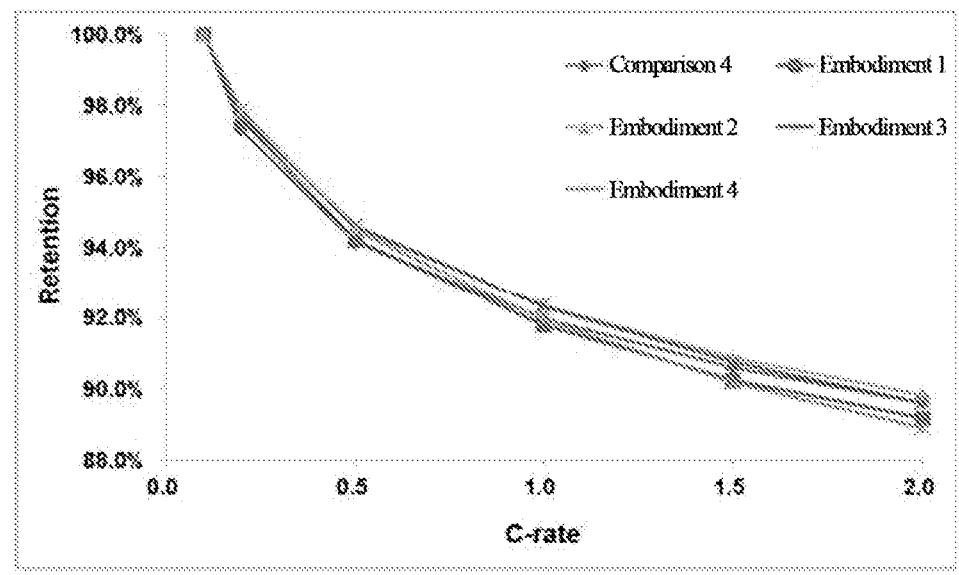
Figure 28B:
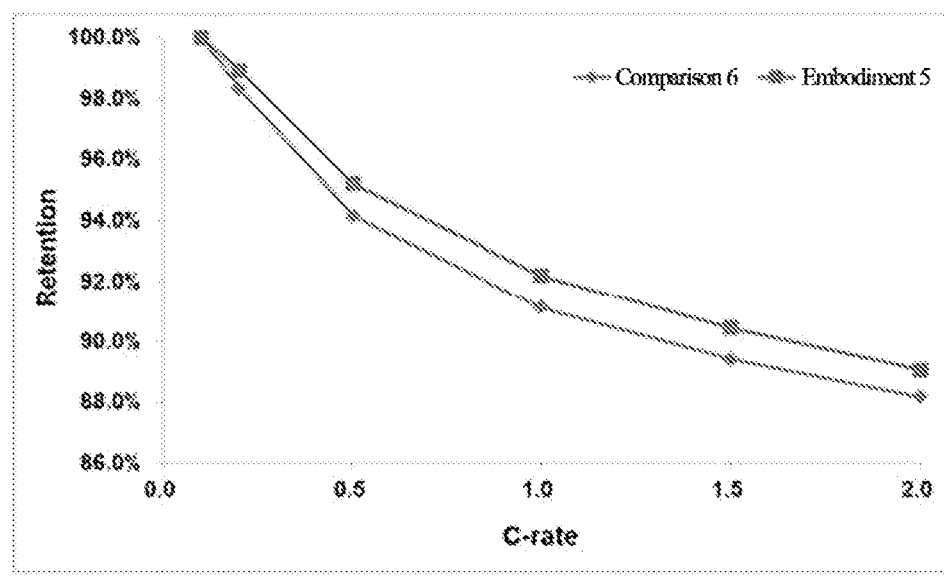
Figure 28C:
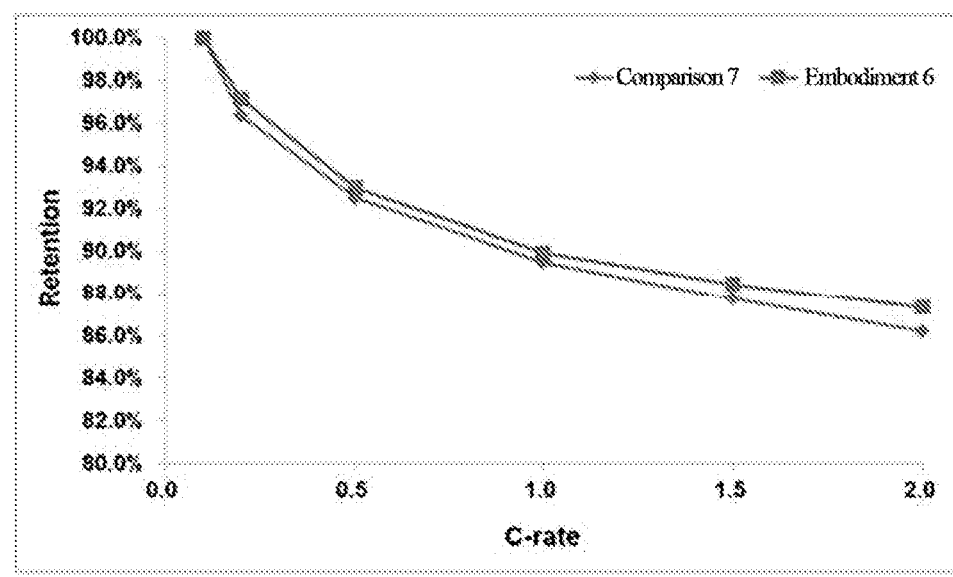
Figure 28D:
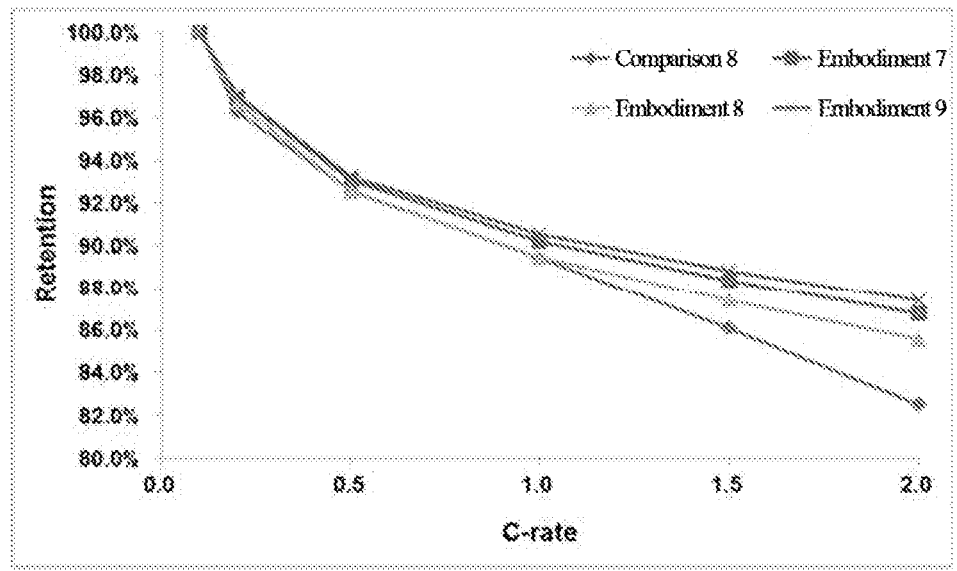
Figure 28E:
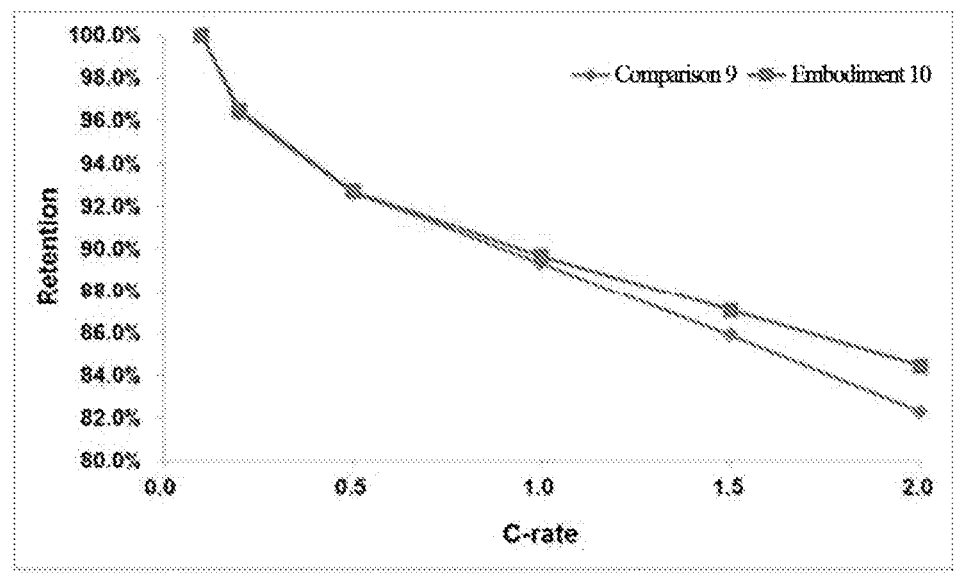

Results of measuring efficiency characteristics of batteries manufactured with active materials manufactured through Embodiments 1 to 10 and Comparisons 4, and 6 to 9 are respectively shown in FIG. 28A (Embodiments 1 to 4, Comparison 4), FIG. 28B (Embodiment 5, Comparison 6), FIG. 28C (Embodiment 6, Comparison 7), FIG. 28D (Embodiments 7 to 9, Comparison 8), and FIG. 28E (Embodiment 10, Comparison 9).

Referring to FIGS. 28A to 28E, the coating process executed by the embodiments of the inventive concept contributed to making the characteristics of capacity and efficiency measured as being more improved than the comparison examples.

Results of measuring the efficiency characteristics of batteries manufactured with active materials manufactured through Embodiments 1 to 10 and Comparisons 4, and 6 to 9 are summarized in Table 5 as follows.

TABLE 5

| ITEM | 0.1 C | 0.2 C | 0.5 C | 1.0 C | 1.5 C | 2.0 C |
|---|---|---|---|---|---|---|
| Embodiment 1 | 100.0% | 97.6% | 94.2% | 91.8% | 90.2% | 89.2% |
| Embodiment 2 | 100.0% | 97.8% | 94.5% | 92.3% | 90.9% | 89.8% |
| Embodiment 3 | 100.0% | 97.7% | 94.6% | 92.3% | 90.7% | 89.6% |
| Embodiment 4 | 100.0% | 97.9% | 94.5% | 91.9% | 90.2% | 88.9% |
| Embodiment 5 | 100.0% | 98.9% | 95.2% | 92.2% | 90.4% | 89.0% |
| Embodiment 6 | 100.0% | 97.2% | 93.0% | 89.9% | 88.4% | 87.3% |
| Embodiment 7 | 100.0% | 96.9% | 93.1% | 90.2% | 88.4% | 86.8% |
| Embodiment 8 | 100.0% | 96.7% | 92.5% | 89.5% | 87.4% | 85.6% |
| Embodiment 9 | 100.0% | 97.0% | 93.2% | 90.5% | 88.8% | 87.4% |

TABLE 5-continued

| ITEM | 0.1 C | 0.2 C | 0.5 C | 1.0 C | 1.5 C | 2.0 C |
|---|---|---|---|---|---|---|
| Embodiment 10 | 100.0% | 96.5% | 92.7% | 89.7% | 87.1% | 84.4% |
| Comparison 4 | 100.0% | 97.3% | 94.2% | 92.0% | 90.6% | 89.6% |
| Comparison 6 | 100.0% | 98.3% | 94.1% | 91.1% | 89.4% | 88.2% |
| Comparison 7 | 100.0% | 96.3% | 92.6% | 89.4% | 86.1% | 82.5% |
| Comparison 8 | 100.0% | 96.3% | 92.6% | 89.4% | 86.1% | 82.5% |
| Comparison 9 | 100.0% | 96.3% | 92.6% | 89.3% | 85.9% | 82.3% |

<Experimental Example> Measuring Battery Characteristics—Lifetime

Figure 29A:
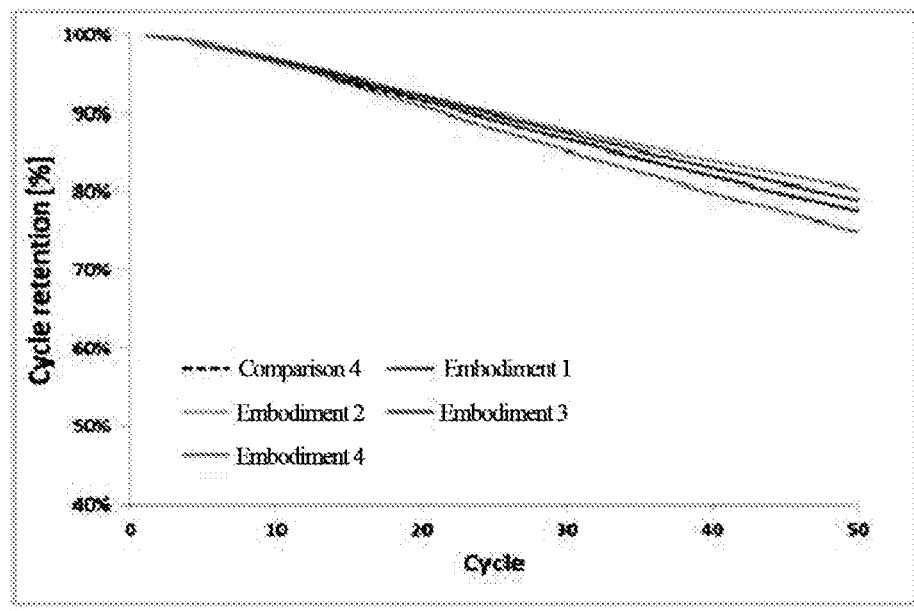
Figure 29B:
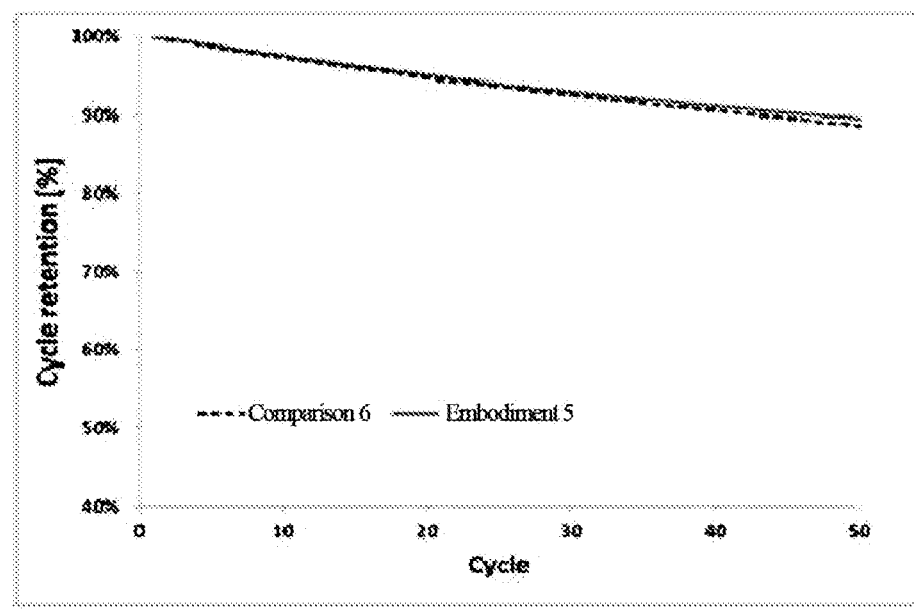
Figure 29C:
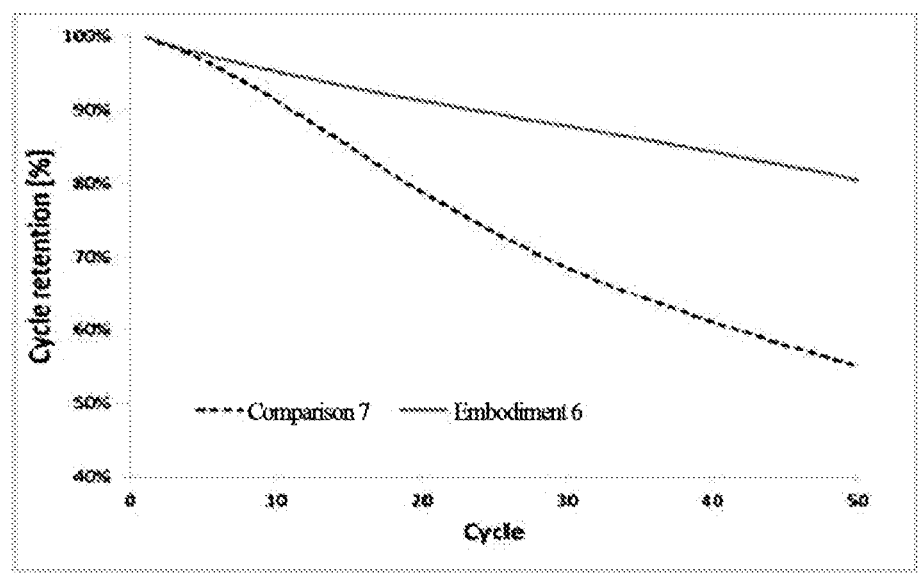
Figure 29D:
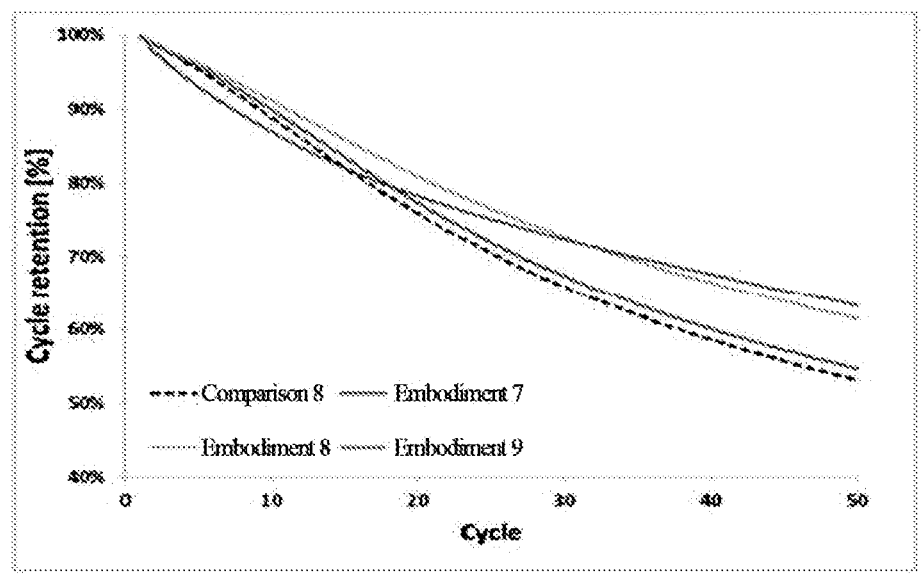
Figure 29E:
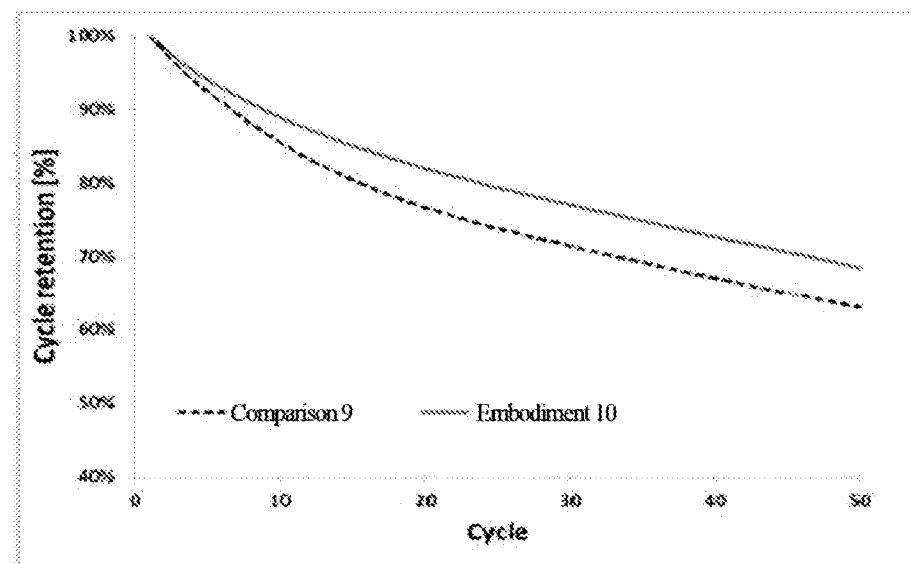

Results of measuring lifetime characteristics of batteries manufactured with active materials manufactured through Embodiments 1 to 10 and Comparisons 4, and 6 to 9 are respectively shown in FIG. 29A (Embodiments 1 to 4, Comparison 4), FIG. 29C (Embodiment 5, Comparison 6), FIG. 29C (Embodiment 6, Comparison 7), FIG. 29D (Embodiments 7 to 9, Comparison 8), and FIG. 29E (Embodiment 10, Comparison 9).

Referring to FIGS. 29A to 29E, the coating process executed according to the embodiments of the inventive concept contributed to making the characteristics of lifetime measured as being more improved than the comparison examples.

Results of measuring the lifetime characteristics of batteries manufactured with active materials manufactured through Embodiments 1 to 10 and Comparisons 4, and 6 to 9 are summarized in Table 6 as follows.

TABLE 6

| | Room Temperature Lifetime 50th/1st (%) |
|---|---|
| Embodiment 1 | 77.4 |
| Embodiment 2 | 80.4 |
| Embodiment 3 | 78.9 |
| Embodiment 4 | 74.9 |
| Embodiment 5 | 89.5 |
| Embodiment 6 | 55.0 |
| Embodiment 7 | 54.6 |
| Embodiment 8 | 61.4 |
| Embodiment 9 | 63.3 |
| Embodiment 10 | 68.5 |
| Comparison 4 | 77.5 |
| Comparison 6 | 88.7 |
| Comparison 7 | 55.0 |
| Comparison 8 | 53.1 |
| Comparison 9 | 63.0 |

Figure 30A:
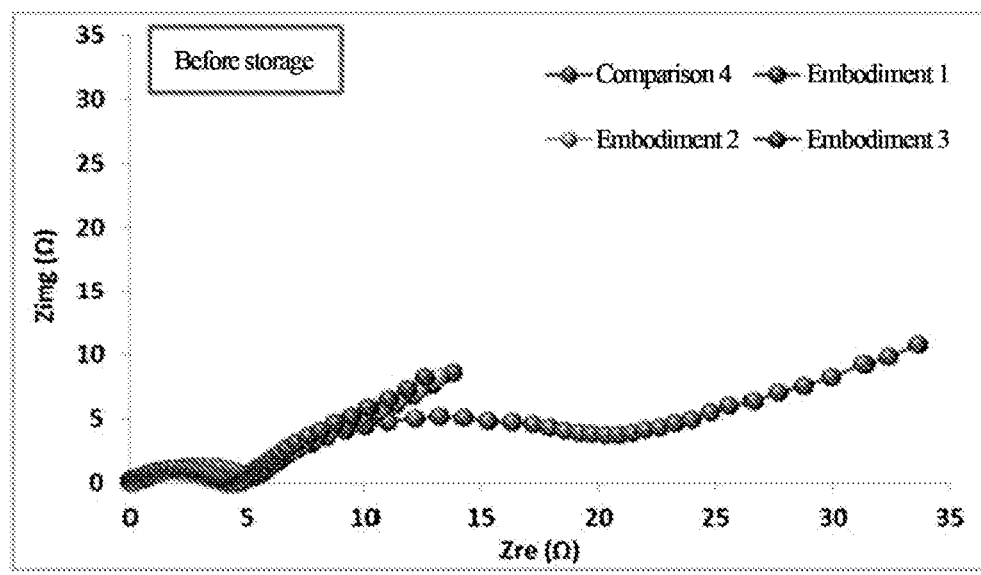
Figure 30B:
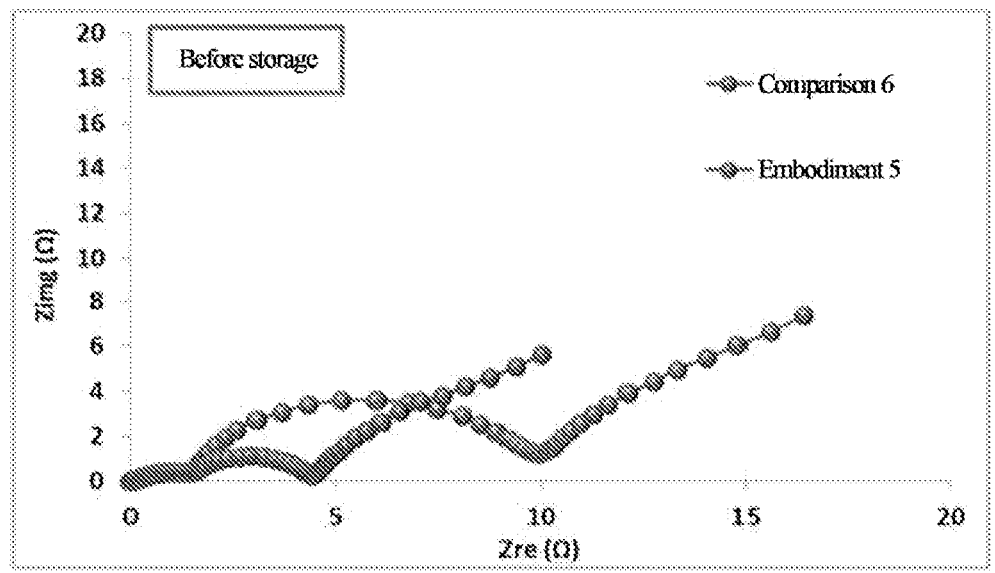
Figure 30C:
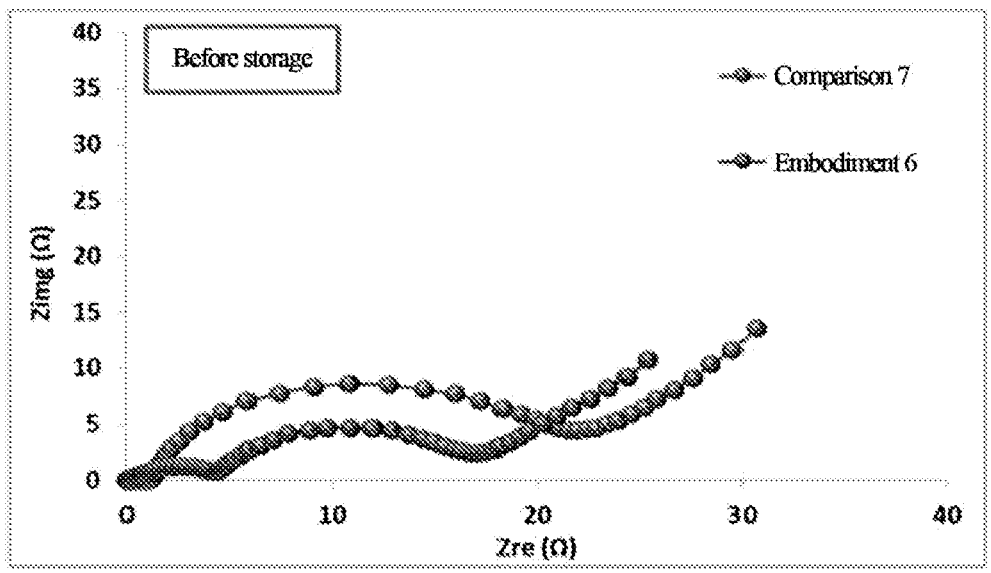
Figure 30D:
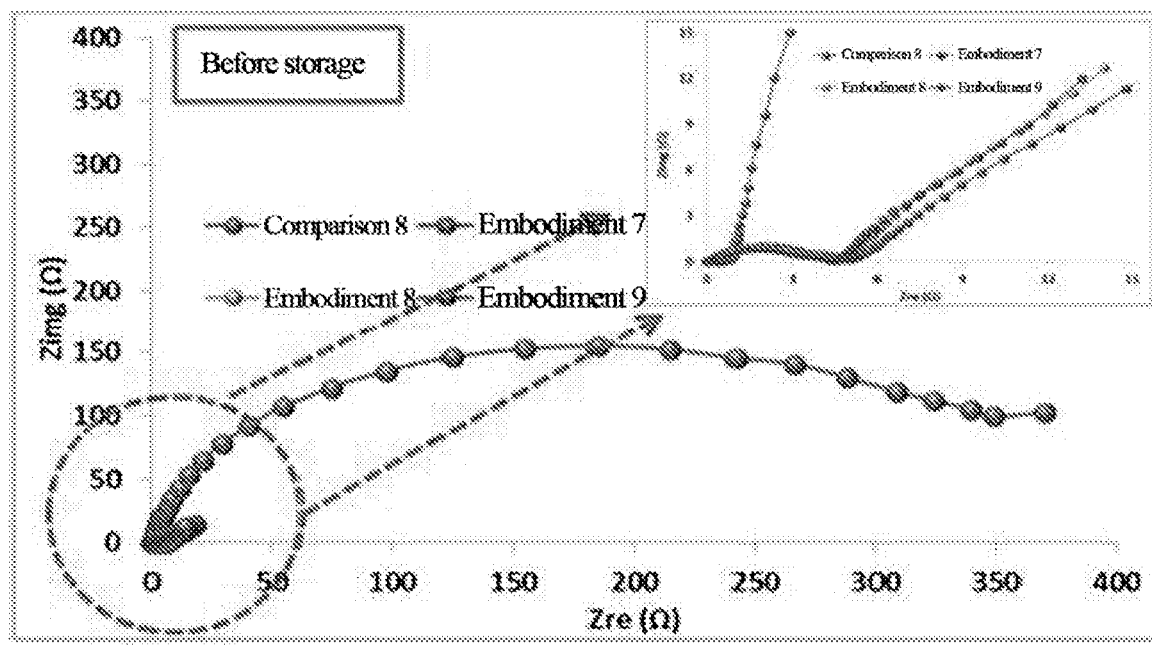
Figure 30E:
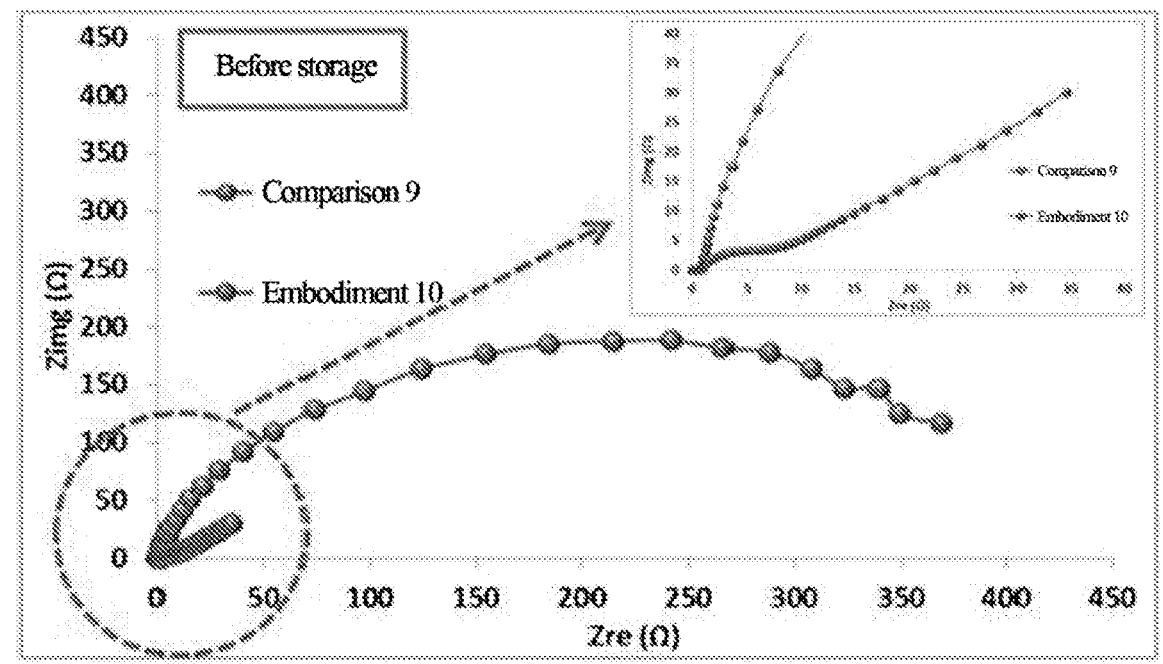
Figure 31A:
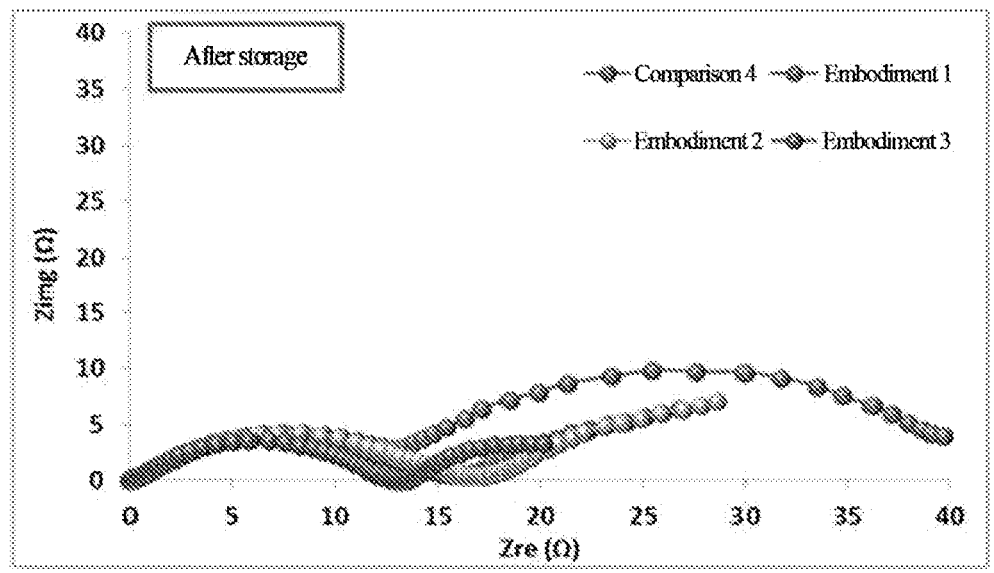
Figure 31B:
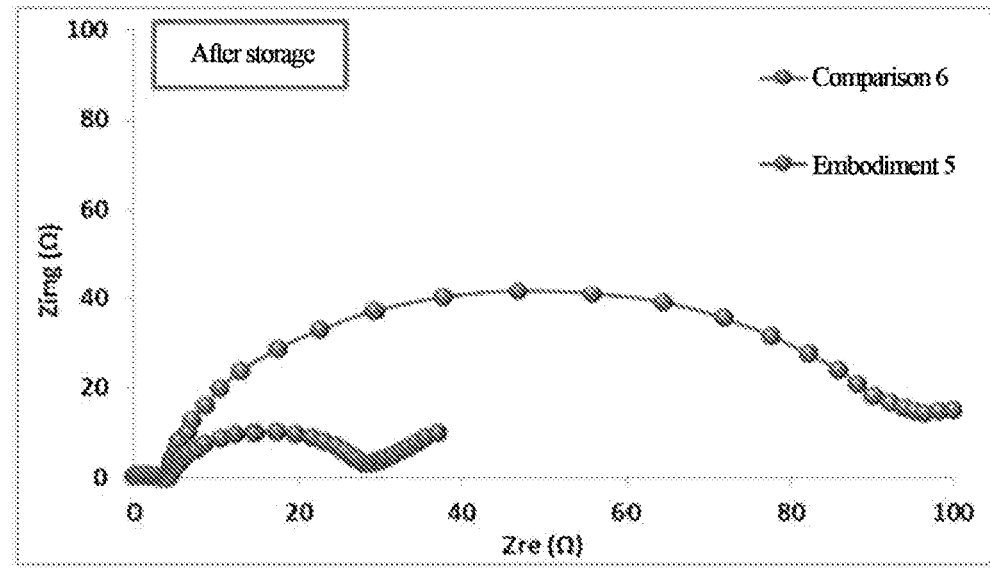
Figure 31C:
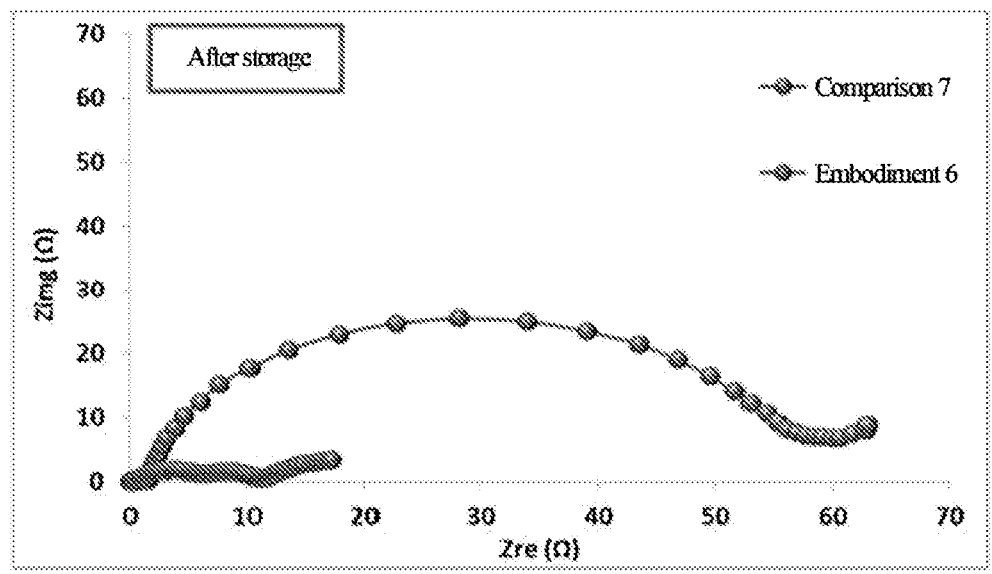
Figure 31D:
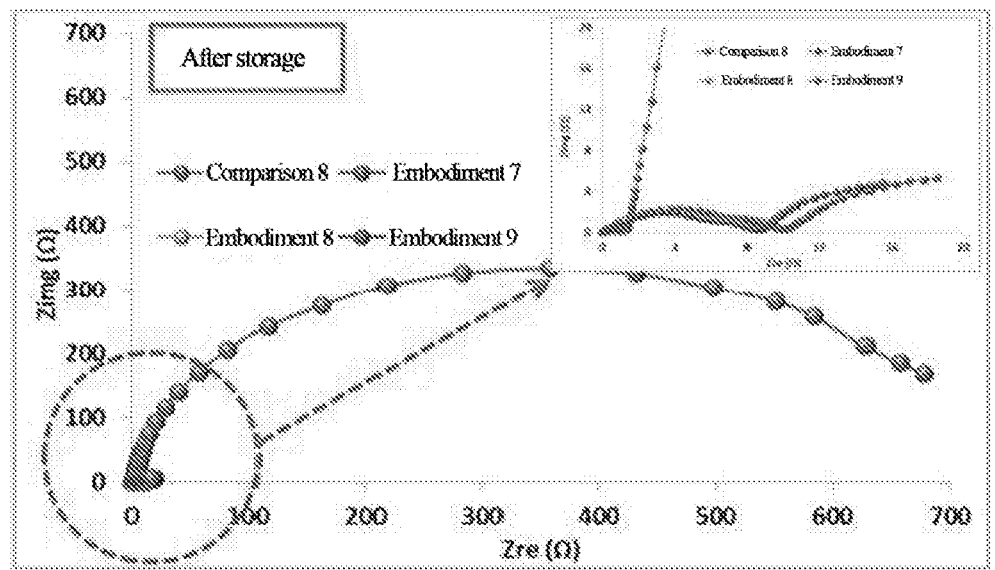
Figure 31E:
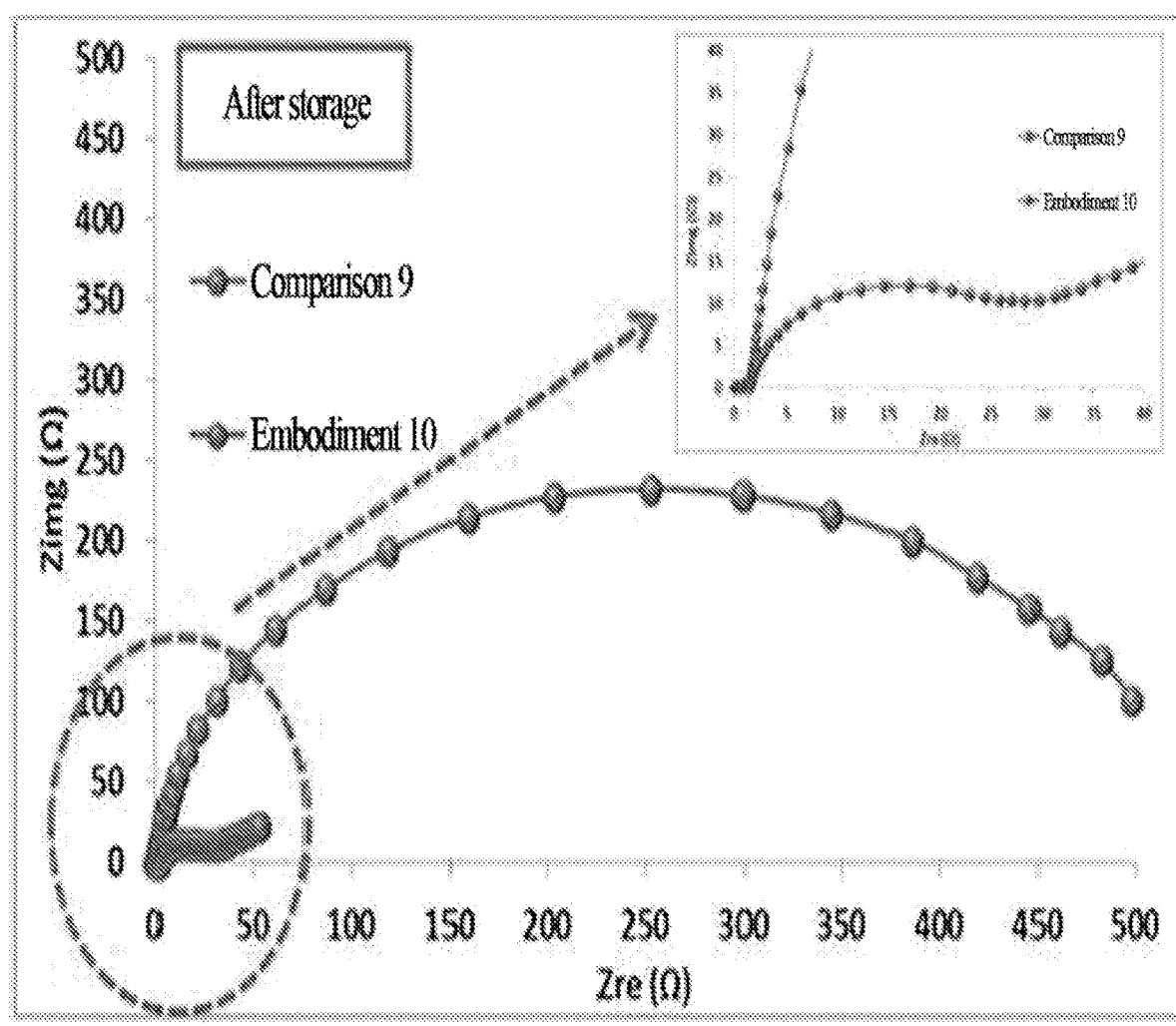

<Experimental Example> Measuring Battery Characteristics—High Temperature Storage As results of measuring high temperature storage characteristics of batteries manufactured with active materials manufactured through Embodiments 1 to 3 and 5 to 10, and Comparisons 4 and 6 to 9, the results before storage are respectively shown in FIG. 30A (Embodiments 1 to 3, Comparison 4), FIG. 30B (Embodiment 5, Comparison 6), FIG. 30C (Embodiment 6, Comparison 7), FIG. 30D (Embodiments 7 to 9, Comparison 8), and FIG. 30E (Embodiment 10, Comparison 9), and the results after storage are respectively shown in FIG. 31A (Embodiments 1 to 3, Comparison 4), FIG. 31B (Embodiment 5, Comparison 6), FIG. 31C (Embodiment 6, Comparison 7), FIG. 31D (Embodiments 7 to 9, Comparison 8), and FIG. 31E (Embodiment 10, Comparison 9).

Referring to FIGS. 30A to 30E and 31A to 31E, the coating process executed by the embodiments of the inventive concept contributed to greatly improving the high temperature storage characteristics because impedances after high temperature storage increased less than those of the comparison examples.

Results of measuring the high temperature storage characteristics of batteries manufactured with active materials manufactured through Embodiments 1 to 3, and 5 to 10 and Comparisons 4, and 6 to 9 are summarized in Table 7 as follows.

TABLE 7

| | High Temperature Storage (Ohm) | |
|---|---|---|
| | Before Storage | After Storage |
| Embodiment 1 | 4.5 | 16.1 |
| Embodiment 2 | 4.3 | 16.6 |
| Embodiment 3 | 4.3 | 13.1 |
| Embodiment 5 | 4.4 | 28.5 |
| Embodiment 6 | 6.2 | 6.7 |
| Embodiment 7 | 5.0 | 10.0 |
| Embodiment 8 | 4.5 | 8.6 |
| Embodiment 9 | 4.5 | 8.7 |
| Embodiment 10 | 7.2 | 28.4 |
| Comparison 4 | 20.8 | 40.3 |
| Comparison 6 | 10.0 | 96.2 |
| Comparison 7 | 21.9 | 60.6 |
| Comparison 8 | 348.9 | 656.0 |
| Comparison 9 | 434.5 | 498.0 |

According to embodiments of the inventive concept, it may be allowable to improve a secondary battery, which includes a lithium complex oxide, in the characteristics of capacity, resistance, and lifetime with different interplanar distances of crystalline structures between a primary particle locating on the surface part of a secondary particle and a primary particle locating in the internal part secondary particle by coating different elements and washing in the processes of forming precursors and/or an active material.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A lithium complex oxide secondary particle which is formed by coagulation of a plurality of primary particles and configured to satisfy a relation as follows, $$d1 > d2 \qquad \text{<Relation>}$$

wherein
the d1 is an interplanar distance of a crystalline structure in a primary particle locating in the internal part of secondary particle among the plurality of primary particles measured from diffraction patterns, and
the d2 is an interplanar distance of a crystalline structure in a primary particle locating on a surface part of the secondary particle measured from diffraction patterns,
wherein the surface part of the secondary particle has a gradient of concentration of Co ions,
wherein a boundary of the primary particle located in the internal part of secondary particle has a gradient of concentration of Co ions, and wherein a boundary of the primary particle located on the surface part of the secondary particle has a gradient of concentration of Co ions.

2. The lithium complex oxide secondary particle of claim 1, wherein the d1, which is the interplanar distance of the crystalline structure in the primary particle locating in the internal part of secondary particle, is configured to be equal to or larger than 4.8 nm to 5.0 nm.

3. The lithium complex oxide secondary particle of claim 1, wherein the d2, which is the interplanar distance of the crystalline structure in the primary particle locating on the surface part of the secondary particle, is configured to be equal to or smaller than 4.75 nm.

4. The lithium complex oxide secondary particle of claim 1,
wherein the lithium complex oxide secondary particle is configured in a hexagonal structure,
wherein a lithium ion pathway is formed toward the center from the surface of the secondary particle.

5. The lithium complex oxide secondary particle of claim 1, wherein a thickness of the surface part of the secondary particle is 0.3 to 1 μm.

6. The lithium complex oxide secondary particle of claim 1, wherein the secondary particle has at least one peak at positions (104), (110), (113), (101), (102), and (003) during XRD analysis.

7. The lithium complex oxide secondary particle of claim 1, wherein the secondary particle has a bound energy (P1) of spin-orbit-spit 2p3/2 peak and a bound energy (P2) of 2p1/2 peak in a Co 2p core-level spectrometry obtained through XPS measurement, and
wherein the P1 and the P2 are ranged in 779 eV≤P1≤780 eV and 794 eV≤P2≤795 eV.

8. The lithium complex oxide secondary particle of claim 1,
wherein the secondary particle has a ratio of peak intensity ($I_{531}$) around 531 eV and peak intensity ($I_{528}$) around 528.5 eV during an O 1s core-level spectrometry that is obtained through XPS measurement, and
wherein the ratio is $I_{531}/I_{528}$≤2.

9. The lithium complex oxide secondary particle of claim 1, wherein the secondary particle has a ratio between peak intensity ($I_{289}$) around 289 eV and peak intensity ($I_{284}$) around 284.5 eV during a C 1s core-level spectrometry that is obtained through XPS measurement, and
wherein the ratio is $I_{289}/I_{284}$≤0.9.

10. The lithium complex oxide secondary particle of claim 1, wherein the secondary particle is given by the following Formula 1,

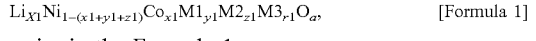   [Formula 1]

wherein, in the Formula 1,
M1 is Mn or Al, and
M2 and M3 are metals selected from a group of Al, Ba, B, Co, Ce, Cr, F, Li, Mg, Mn, Mo, P, Sr, Ti, and Zr, and
wherein
0.95≤X1≤1.05,
1.50≤a≤2.1,
0.02≤x1≤0.25,
0.01≤y1≤0.20,
0≤z≤0.20, and
0≤r1≤0.20.

11. A method of preparing a lithium complex oxide secondary particle by claim 1, the method comprising:
manufacturing precursors of a lithium complex oxide secondary particle given by the following Formula 2,

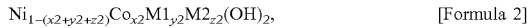   [Formula 2]

wherein, in Formula 2,
M1 is Mn or Al, and
M2 is a metal selected from a group of Al, Ba, B, Co, Ce, Cr, F, Li, Mg, Mn, Mo, P, Sr, Ti, and Zr, and
wherein 0≤x2≤0.25, 0≤y2≤0.20, and 0≤z2≤0.20;
reacting precursors of a lithium complex oxide secondary particle with a lithium compound and manufacturing a positive active material by first thermal treating the reactant;
washing the positive active material with distilled water or an alkaline solution;
reactively coating the washed positive active material with a solution containing M2 that is a metal selected from the group of Al, Ba, B, Co, Ce, Cr, F, Li, Mg, Mn, Mo, P, Sr, Ti, and Zr;
drying particles of the positive active material; and
mixing the dried positive active material with M3 that is a metal selected from the group of Al, Ba, B, Co, Ce, Cr, F, Li, Mg, Mn, Mo, P, Sr, Ti, and Zr and doping the metal M3 into the particles by second thermally treating the mixture.

12. The method of claim 11, wherein the reactively coating comprises:
reactively coating the washed positive active material with the solution including Co.

13. A lithium secondary battery comprising a lithium complex oxide secondary particle of claim 1.

14. The lithium secondary battery of claim 13, wherein the lithium secondary battery is configured to have residual lithium equal to or smaller than 6,000 ppm.

15. A lithium complex oxide secondary particle formed by a method comprising:
manufacturing precursors of a lithium complex oxide secondary particle given by the following Formula 2,

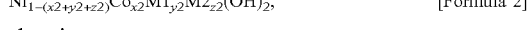   [Formula 2]

wherein,
M1 is Mn or Al, and
M2 is a metal selected from a group of Al, Ba, B, Co, Ce, Cr, F, Li, Mg, Mn, Mo, P, Sr, Ti, and Zr, and
wherein 0≤x2≤0.25, 0≤y2≤0.20, and 0≤z2≤0.20;
reacting precursors of a lithium complex oxide secondary particle with a lithium compound and manufacturing a positive active material by first thermal treating the reactant;
washing the positive active material with distilled water or an alkaline solution;
reactively coating the washed positive active material with a solution containing M2 that is a metal selected from the group of Al, Ba, B, Co, Ce, Cr, F, Li, Mg, Mn, Mo, P, Sr, Ti, and Zr;
drying particles of the positive active material; and
mixing the dried positive active material with M3 that is a metal selected from the group of Al, Ba, B, Co, Ce, Cr, F, Li, Mg, Mn, Mo, P, Sr, Ti, and Zr and doping the metal M3 into the particles by second thermally treating the mixture, and
wherein,
the lithium complex oxide secondary particle is configured to satisfy a relation as follows, $d1>d2$   <Relation> wherein,
the d1 is an interplanar distance of a crystalline structure in a primary particle locating in the internal part of secondary particle among the plurality of primary particles measured from diffraction patterns;

the d2 is an interplanar distance of a crystalline structure in a primary particle locating on a surface part of the secondary particle measured from diffraction patterns;

the surface part of the secondary particle has a gradient of concentration of Co ions;

a boundary of the primary particle located in the internal part of secondary particle has a gradient of concentration of Co ions; and a boundary of the primary particle located on the surface part of the secondary particle has a gradient of concentration of Co ions.

\* \* \* \* \*